United States Patent [19]
Takahashi et al.

[11] Patent Number: 5,682,046
[45] Date of Patent: Oct. 28, 1997

[54] HETEROJUNCTION BIPOLAR SEMICONDUCTOR DEVICE AND ITS MANUFACTURING METHOD

[75] Inventors: Tsuyoshi Takahashi; Hiroshi Yamada; Kazukiyo Joshin, all of Kawasaki; Shigehiko Sasa, Hirakata, all of Japan

[73] Assignee: Fujitsu Limited, Kawasaki, Japan

[21] Appl. No.: 553,034

[22] Filed: Nov. 3, 1995

Related U.S. Application Data

[63] Continuation-in-part of Ser. No. 288,928, Aug. 11, 1994, abandoned.

[30] Foreign Application Priority Data

| Aug. 12, 1993 | [JP] | Japan | 5-200832 |
| Jul. 25, 1994 | [JP] | Japan | 6-172944 |
| Jun. 20, 1995 | [JP] | Japan | 7-153547 |

[51] Int. Cl.⁶ ............... H01L 29/73; H01L 29/10
[52] U.S. Cl. ............ 257/198; 257/631; 257/636; 437/235; 437/126; 437/133
[58] Field of Search ............... 257/198, 197, 257/200, 190, 631, 636; 437/235, 236, 126, 133

[56] References Cited

U.S. PATENT DOCUMENTS

| 5,552,617 | 9/1996 | Hill et al. | 257/197 |
| 5,557,117 | 9/1996 | Matsuoka et al. | 257/184 |
| 5,569,944 | 10/1996 | Delaney et al. | 257/198 |
| 5,598,015 | 1/1997 | Tanoue et al. | 257/197 |

OTHER PUBLICATIONS

Electronic Letters, Dec. 1992, Dubon–Chevallier et al., vol. 28, *Innovative Passivated Heterojunction Bipolar Transistor Grown by CBE.*

Extended Abstracts of the 1992 International Conference on Solid State Device and Materials, Tsukuba, 1992, Wu et al., pp. 316–318, *High Performance $In_{0.49}Ga_{0.51}P/GaAs$ Tunneling Emitter Bipolar Transistor Grown by Gas Source Molecular Beam Epitaxy.*

*Primary Examiner*—Donald Monin
*Attorney, Agent, or Firm*—Armstrong, Westerman, Hattori, McLeland & Naughton

[57] ABSTRACT

A heterojunction bipolar transistor has a support substrate, a collector layer formed on the support substrate, a base layer formed on the collector layer containing arsenic as group V element, a first emitter layer formed on the base layer, containing phosphorus as group V element, and having a band gap wider than the base layer, an emitter passivation layer formed on the first emitter layer made of semiconductor having a function of passivating the surface of the first emitter layer, and a base electrode forming an ohmic contact with the base layer. The whole upper surface of the base layer is covered with the first emitter layer and base electrode, the whole upper surface of the first emitter layer is covered with the emitter passivation layer, and the region of the first emitter layer adjacent to the edge of the base electrode is depleted throughout the full depth thereof.

36 Claims, 15 Drawing Sheets

HETEROJUNCTION BIPOLAR SEMICONDUCTOR DEVICE AND ITS MANUFACTURING METHOD

CROSS REFERENCE TO RELATED APPLICATION

This application is a continuation-in-part application of a U.S. patent application, Ser. No. 08/288,928, filed on Aug. 11, 1994, now abandoned.

BACKGROUND OF THE INVENTION a) Field of the Invention

The present invention relates generally to a bipolar transistor, and more particularly to a heterojunction bipolar transistor (HBT). HBT can operate at a high speed and has a high current driving ability so that it is expected to be applied to microwave devices, optical communications drivers, and other devices.

b) Description of the Related Art

HBT has an emitter region made of semiconductor material having a wider band gap than the base region. As a forward bias is applied to a base-emitter junction, majority carriers in the emitter region are injected into the base region. However, because of a difference between band gaps of the emitter and base regions, majority carriers in the base region are not likely to be injected into the emitter regions. From this reason, a high current gain can be expected even if the impurity concentration of the base region is raised.

FIG. 10A shows a conventional HBT of AlGaAs/GaAs system. A collector layer 51, a p-type GaAs base layer 52, and an n-type AlGaAs emitter layer 53 are formed on a GaAs substrate 50 in this order from the bottom. The emitter, base, and collector layers are mesa-etched in this order into a stepwise shape, and an emitter electrode 57, a base electrode 56, and a collector electrode 55 are formed on the emitter, base, and collector layers.

P-type GaAs of the base layer has a high surface recombination rate. Therefore, if the base layer 52 is exposed, electrons are trapped by the exposed surface and a current gain is lowered. It is therefore preferable not to expose the base layer 52 to avoid a low current gain. To this end, it is effective to cover the base layer 52 with a thin emitter layer 58 called a guard ring (base passivation layer) formed between the emitter layer 53 and base electrode 56.

Although the emitter layer 53 and base electrode 56 are connected together via the guard ring 58, if the guard ring is depleted, carriers will not flow directly from the base electrode 56 to the emitter layer 53.

In order to form the guard ring 58 having such a structure, it is necessary to leave the guard ring 58 having a thickness of 30 to 100 nm by dry- or wet-etching AlGaAs of the emitter layer 53 for a predetermined etching time. It is not easy to leave the guard ring 58 having such a thin film thickness by controlling the etching time.

FIG. 10B shows another HBT having a structure capable of overcoming the above problem. This HBT structure is disclosed in Japanese Patent Laid-open Publication Hei 4-286126. The different points of this HBT from HBT shown in FIG. 10A are that the emitter layer 53 is separated into two emitter layers 53a and 53b by an etching stopper layer 59 containing In and that another etching stopper layer 60 containing In is inserted at the interface between the base layer 52 and emitter layer 53b.

The emitter layer 53a is etched so as to form a guard ring 58. This etching stops at the etching stopper layer 59. If the emitter layer 53b is formed to have a predetermined film thickness, the guard ring 58 can be formed easily without precisely controlling the etching time. The emitter layers 53a and 53b are mesa-etched to expose the base surface. This etching stops at the etching stopper layer 60 on the surface of the base layer 52.

FIG. 10C shows another HBT having a structure capable of overcoming the problem of HBT having the structure shown in FIG. 10A. This HBT structure is disclosed in Japanese Patent Laid-open Publication Hei 3-053563. A GaAs base layer 52 is covered with a very thin AlGaAs emitter layer 53c having a thickness of about 25 nm, and an n-type GaAs cap layer 61 is formed on the emitter layer 53c.

A mesa structure is formed by selectively dry-etching the emitter cap layer 61. If a GaAs etching gas which does not etch AlGaAs is used, the emitter layer 53c can be left on the base layer 52.

A base electrode 56 such as AuBe is formed around the mesa emitter cap layer 61.

With this structure, the whole surface of the base layer 52 is covered with the emitter layer 53c. A guard ring 58 of AlGaAs can thus be formed on the base layer 52. A similar structure having an emitter layer 53c of InGaP is written in SSDM92, Extend Abstract at page 316, and Electronic letters Vol 28 P2303 (1992).

In order to improve the high frequency characteristics of HBT, it is necessary to raise the impurity concentration of the base region so as to lower the base resistance. However, as the impurity concentration of the base region is raised, holes in the base region flow to the emitter region, tending to reduce a current gain.

An energy difference of valence bands at an interface between an InGaP emitter region and a GaAs base region is larger than that between an AlGaAs emitter and a GaAs base region. Therefore, if an InGaP emitter region is used, majority hole carriers in the base region are theoretically suppressed from injecting into the emitter region. It can be reasoned from this that a current gain of HBT with an InGaP emitter region is improved more than a current gain of HBT with an AlGaAs emitter region.

Similarly, an InGaAs base region with an InP emitter region can theoretically improve a current gain more than an InAlAs emitter region. Therefore, use of emitter material of group III–V compound semiconductor having phosphorus as a group V element can theoretically suppress a reduction of a current gain when the base region has a high impurity concentration. HBTs using InP or InGaP as emitter material are expected to be used as microwave devices.

However, the etching controllability of InP and InGaP is poor, and it is not easy to precisely etch and leave a guard ring such as shown in FIG. 10A.

Phosphorus-based semiconductor, particularly semiconductor containing In as a group III element is very unstable relative to a surface passivation film.

SUMMARY OF THE INVENTION

It is an object of the present invention to provide an HBT having good high frequency characteristics capable of forming a base region having a high impurity concentration without lowering a current gain and capable of preventing a time-dependent leak current increase between the base and emitter regions.

According to one aspect of the present invention, there is provided a heterojunction bipolar type semiconductor device including: a support substrate, a collector layer of group III-V compound semiconductor formed on the support substrate; a base layer formed on the collector layer made of group III-V compound semiconductor containing arsenic as group V element; a first emitter layer formed on the base layer made of group III-V compound semiconductor containing phosphorus as group V element, the first emitter layer having a band gap wider than the base layer; an emitter passivation layer formed on the first emitter layer and having a function of passivating the surface of the first emitter layer; and a base electrode forming an ohmic contact with the base layer, wherein substantially the whole upper surface of the base layer is covered with the first emitter layer or with the first emitter layer and the base electrode, substantially the whole upper surface of the first emitter layer is covered with the emitter passivation layer or with the emitter passivation layer and the base electrode, and the region of the first emitter layer is completely depleted adjacent to the edge of the base electrode throughout the full depth thereof.

Material of the first emitter layer contacting the base layer is phosphorus-based group III-V compound semiconductor containing phosphorus as group V element, such as InP and InGaP. It is therefore possible to provide a large energy difference of valance bands at an interface between the emitter and base. Accordingly, a current gain is not likely to be lowered even if the base of a high impurity concentration is used, thereby improving the high frequency characteristics. At the region of the guard ring, the surface of the base layer may be covered with the first emitter layer and emitter passivation layer. Therefore, it is possible to suppress surface recombination or the like and improve the reliability.

If a phosphorus-based second emitter layer is formed on the emitter passivation layer, an arsenic-based thin film containing arsenic as group V element can be inserted into the phosphorus-based emitter layer as an emitter passivation layer and an etching stopper layer. It is possible to stop etching while leaving a thin film of the first emitter layer and the emitter passivation layer. It is therefore possible to easily form a guard ring between the emitter region and base electrode. The surface of the base region is not exposed so that it is possible to suppress the recombination of electrons at an base layer interface, thereby improving a current gain.

At the region of the guard ring, the surface of the first emitter layer of indium-based group III-V compound semiconductor may be covered with an etching stopper layer of another group III-V compound semiconductor not including indium. Therefore, it is possible to form the structure which prevents a direct contact of the indium-based group III-V compound semiconductor with the insulating passivation film. Accordingly, an instability can be avoided which may be caused by a contact of indium-based group III-V compound semiconductor with the insulating passivation film.

With the structure in that arsenic-based group III-V compound semiconductor is embedded in phosphorus-based group III-V compound semiconductor, it is possible not to form a potential barrier for electron transport regardless of the use of the etching stopper layer.

The above advantages are obtained also in the case of an arsenic-based second emitter layer, by using an emitter passivation layer having an etch selectivity relative to the second emitter layer.

As described above, the present invention can form HBTs having good high frequency characteristics without lowering a current gain.

DETAILED DESCRIPTION OF THE PREFERRED EMBODIMENTS

Figure 1:
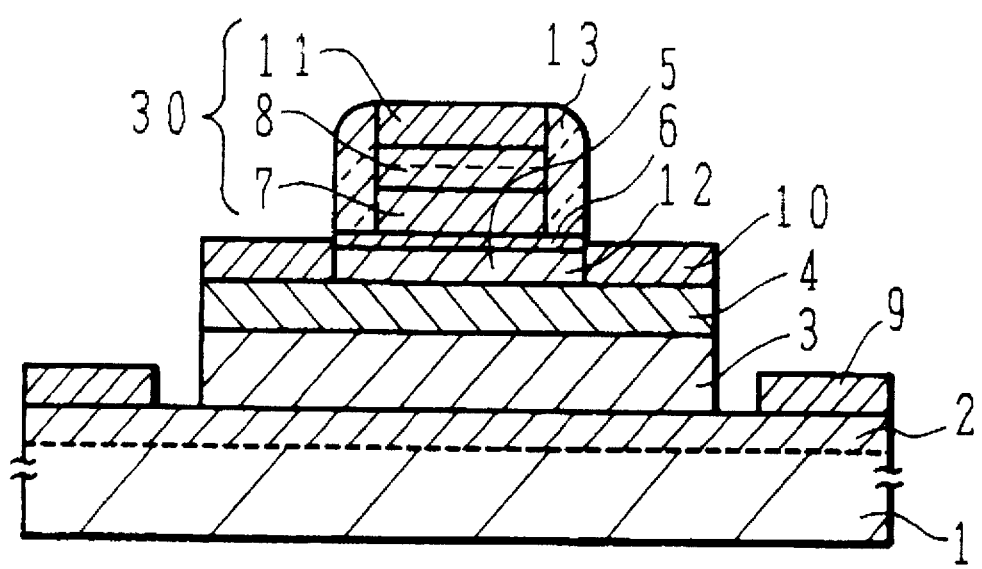
FIG. 1 is a cross sectional view of an HBT according to a first embodiment of the invention.

An HBT of the first embodiment of the invention will be described with reference to FIG. 1 and FIGS. 2A to 2D.

On a semiinsulating GaAs substrate 1, an $n^+$-type GaAs collector contact layer 2, an n-type GaAs collector layer 3, a $p^+$-type GaAs base layer 4, an n-type InGaP first emitter layer 5, an n-type GaAs emitter passivation layer 6, an n-type InGaP second emitter layer 7, and an emitter cap layer 8 of a two-layer structure having an $n^+$-type GaAs layer and an $n^+$-type InGaAs layer, are formed in this order from the bottom by gas source MBE, MOCVD, or the like. The emitter layer is a layer whose main purpose is to form a junction with the base layer, and the emitter cap layer is a layer to improve a contact of the emitter with the emitter electrode. However, in many cases, such a difference is not substantial.

An impurity concentration of the GaAs collector contact layer 2 is about $3\times10^{18}$ cm$^{-3}$, and a film thickness thereof is about 500 nm. An impurity concentration of the GaAs collector layer 3 is about $3\times10^{16}$ cm$^{-3}$, and a film thickness thereof is about 400 nm. An impurity concentration of the GaAs base layer 4 is about $4\times10^{19}$ cm$^{-3}$, and a film thickness thereof is about 70 nm. An impurity concentration of the InGaP emitter layer 5 is about $5\times10^{17}$ cm$^{-3}$, and a film thickness thereof is about 50 nm.

An impurity concentration of the GaAs emitter passivation layer 6 is about $5\times10^{17}$ cm$^{-3}$, and a film thickness thereof is about 5 nm. An impurity concentration of the InGaP emitter layer 7 is about $5\times10^{17}$ cm$^{-3}$, and a film thickness thereof is about 100 nm. An impurity concentration of the GaAs layer of the emitter cap layer 8 is about $3\times10^{18}$ cm$^{-3}$, and a film thickness thereof is about 100 nm. An impurity concentration of the InGaAs layer of the emitter cap layer 8 is about $5\times10^{19}$ cm$^{-3}$, and a film thickness thereof is about 100 nm. The emitter cap layer 8 may be formed as a single layer. The two-layer structure lowers a contact resistance.

Figure 2A:
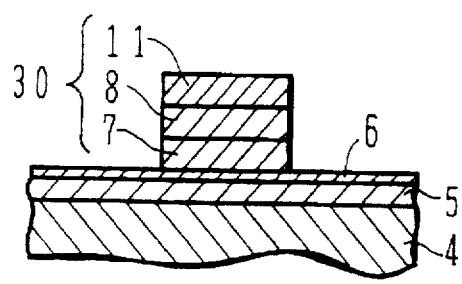
FIGS. 2A to 2D are cross sectional views of the main part of the HBT of the first embodiment, explaining the processes of manufacturing it.

A method of manufacturing the HBT of the first embodiment will be described with reference to FIGS. 2A to 2D. FIG. 2A illustrates a process of forming an emitter mesa structure. On the substrate having a multi-layer structure prepared in the above manner, a tungsten silicide (WSi) film for an emitter electrode 11 is formed to a thickness of about 500 nm. The WSi film is removed at the region where the emitter is not formed, by photolithography.

Next, using the WSi film 11 as a mask, the GaAs/InGaAs emitter cap layer 8 is etched to expose the surface of the InGaP emitter layer 7. Thereafter, the emitter layer 7 is etched by a mixed solution of hydrochloric acid and pure water. The mixed solution of hydrochloric acid and pure water does not etch GaAs so that the etching stops at the surface of the GaAs emitter passivation layer 6. In this manner, an emitter mesa 30 is formed which has three layers, including the InGaP emitter layer 7, GaAs/InGaAs emitter cap layer 8, and WSi emitter electrode 11.

Figure 2C:
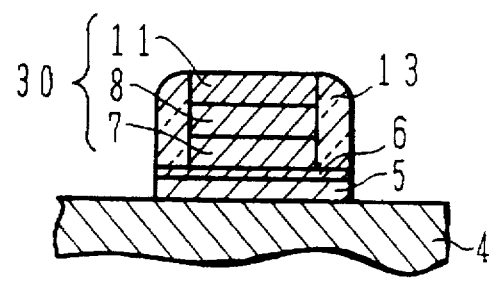
Figure 2B:
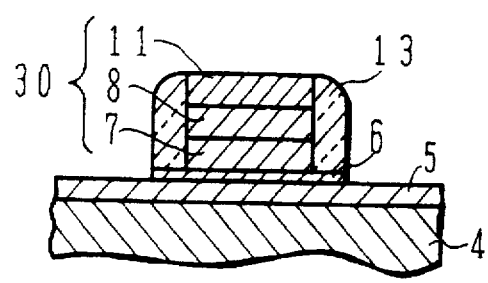

FIG. 2B illustrates a process of etching the emitter passivation layer 6. On the substrate formed by the process illustrated in FIG. 2A, an SiO$_2$ film is deposited by CVD or the like. A side wall or a side wall oxide region 13 is formed on the vertical wall of the emitter mesa 30 by anisotropic reactive ion etching or the like.

By using the side wall as a mask, the GaAs emitter passivation layer 6 is etched by a mixed solution of phosphoric acid (H$_3$PO$_4$), hydrogen peroxide (H$_2$O$_2$), and pure water. This etching solution does not etch InGaP so that the etching stops at the surface of the InGaP emitter layer 5.

FIG. 2C illustrates a process of exposing the base region. After the process illustrated in FIG. 2B, the InGaP emitter layer 5 is etched by a mixed solution of hydrochloric acid and pure water to expose the surface of the GaAs base layer 4.

Figure 2D:
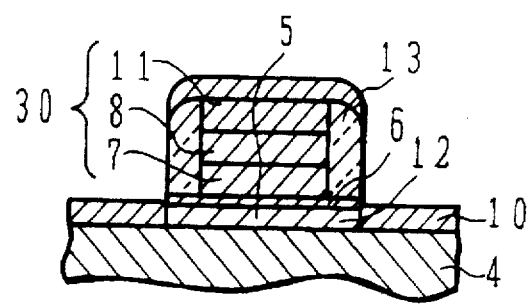

FIG. 2D illustrates a process of vapor-depositing a base electrode. Ti, Pt, and Au are vapor-deposited on the substrate in this order to the thicknesses of 10 nm, 50 nm, and 200 nm, respectively. As a result, the surface of the emitter electrode 11 and base layer 4 is covered with a Ti/Pt/Au film. A very thin Ti/Pt/Au film is deposited on the side wall 13 because a vapor-deposited film has a directivity.

Next, argon ion milling is performed in an oblique direction to etch the surface of the side wall and remove an unnecessary Ti/Pt/Au film. The emitter electrode 11 and base electrode 10 are therefore electrically fully separated. In this manner, the base electrode is formed in a self-alignment manner relative to the emitter.

Next, the base region is protected by a photoresist mask and an unnecessary Ti/Pt/Au film is removed by ion milling. The emitter and base regions are masked and mesa-etching is performed by a mixed solution of phosphoric acid, hydrogen peroxide, and pure water to expose the GaAs collector contact layer 2 (refer to FIG. 1). A resist mask is formed by lithography and a collector contact region for a collector electrode is exposed. AuGe and Au are vapor-deposited to the thicknesses of 20 nm and 800 nm, respectively, and a collector electrode 9 is formed through lift-off of unnecessary portions of the deposited film. Thereafter, a thermal treatment is performed at a temperature of 350° to 450° C. to form a collector ohmic contact.

The structure of the HBT formed in the above manner is shown in FIG. 1. As shown, the surface of the base layer 4 between the emitter region and the base electrode 10 is fully covered with a guard ring 12 made of part of the InCa P emitter layer 5. The upper surface of the guard ring is covered with the GaAs emitter passivation layer 6. As a result, the InGaP emitter layer 5 does not contact the surface layer film directly, thereby preventing an increase of a leak current.

In this embodiment, HBT of the InGaP/GaAs structure has been described. HBT of the InP/InGaAs structure may be formed by the same processes as described above. Although the GaAs emitter passivation layer is used as the etching stopper layer for the InGaP emitter, other arsenic-based group III-V compound semiconductor materials such as AlGaAs may be used. Phosphorus-based group III-V compound semiconductor and arsenic-based group III-V compound semiconductor having different group V elements can be selectively etched with ease. Although a single GaAs layer is used both for the etching stop and for the protection of the side wall insulation film at the emitter layer, two different layers may be used.

Although InGaAs is used as the etching stopper layer in the InP emitter structure, InAlAs or InAlGaAs may also be used. Although the etching stopper layer lattice-matching the emitter layer is used, if the etching stopper layer is sufficiently thin, it is not necessary to have a good lattice constant matching.

Although side wall type self-alignment structure is shown in FIGS. 2A to 2D, a T-character type self-alignment structure having an overhand may also be used. Instead of the SiO$_2$ side wall, other insulating materials such as SiN, SiON may be used. Instead of the Ti/Pt/Au base electrode, other materials may be used.

An HBT of the second embodiment of the invention will be described with reference to FIG. 3 and FIGS. 4A to 4D.

Figure 3:
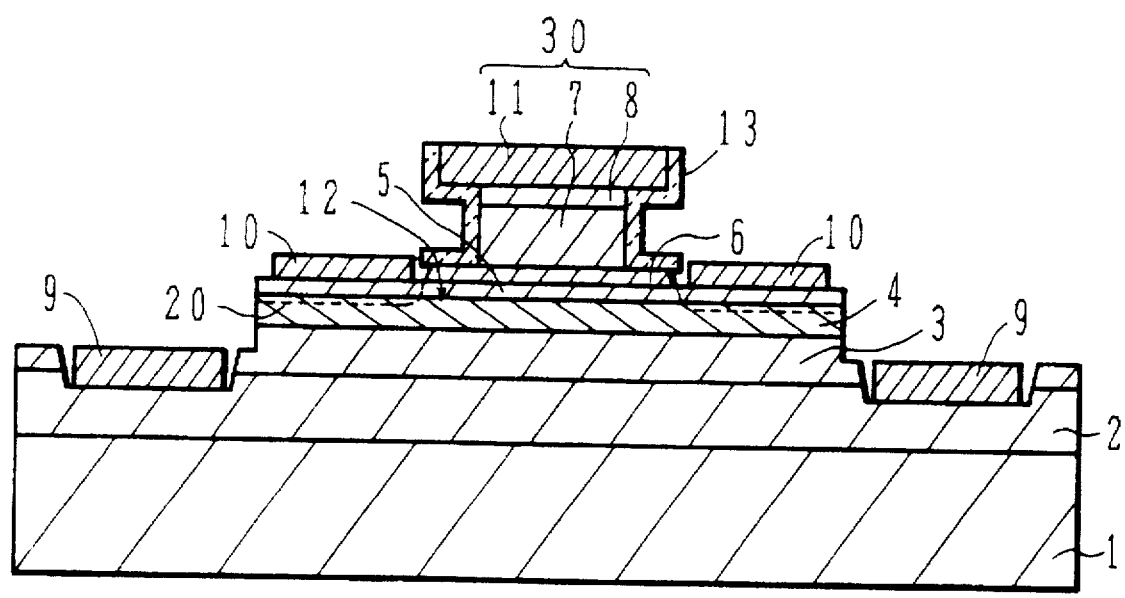
FIG. 3 is a cross sectional view of an HBT according to a second embodiment of the invention.

FIG. 3 is a cross sectional view of the HBT of the second embodiment. The structure of this HBT has the following different points from that of the first embodiment shown in FIG. 1. An emitter electrode 11 has an overhang extending away from the end of the emitter mesa 30, and a base electrode 10 is formed in a self-alignment manner by using the overhang. The base electrode 10 has an ohmic contact with the base layer 4, the ohmic contact being formed by an electrode reaction region 20 which extends from the base electrode 10 to the GaAs base layer 4 via an InGaP emitter layer 5.

The HBT shown in FIG. 1 has the upper second emitter layer 7 made of InGaP, whereas the HBT shown in FIG. 3 has an upper second emitter layer 7 made of GaAs. In order to provide an etch selectivity of the upper second emitter layer 7, an emitter passivation layer or etching stopper layer 6 is made of n-type AlGaAs.

A method of manufacturing the HBT shown in FIG. 3 will be described with reference to FIGS. 4A to 4D.

Figure 4A:
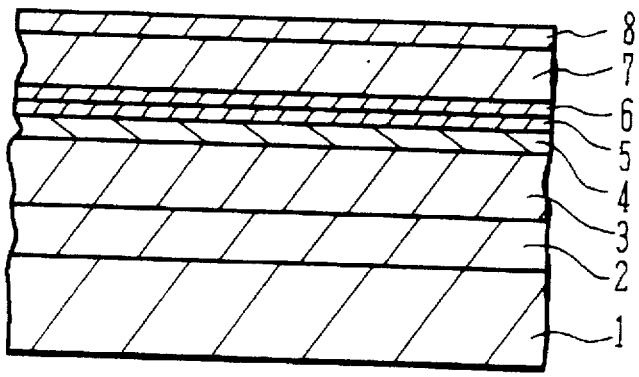
FIGS. 4A to 4D are cross sectional views of the main part of the HBT of the second embodiment, explaining the processes of manufacturing it.

As shown in FIG. 4A, on a semiinsulating GaAs substrate 1, an n$^+$-type GaAs collector contact layer 2, an i-type GaAs collector layer 3, a p$^+$-type GaAs base layer 4, an n-type InGaP first emitter layer 5, an n-type AlGaAs emitter passivation layer 6, an n-type GaAs second emitter layer 7, and an n$^+$-type InGaAs emitter cap layer 8, are formed in this order from the bottom by gas source MBE, MOCVD, or the like.

An impurity concentration of the GaAs collector contact layer 2 is about $3\times10^{18}$ cm$^{-3}$, and a film thickness thereof is about 500 nm. The GaAs collector layer 3 is undoped with impurities, and a film thickness thereof is about 450 nm. With an i-type collector layer, a collector breakdown voltage can be raised easily. An impurity concentration of the GaAs base layer 4 is about $4\times10^{19}$ cm$^{-3}$, and a film thickness thereof is about 70 nm. An impurity concentration of the InGaP emitter layer 5 is about $5\times10^{17}$ cm$^{-3}$, and a film thickness thereof is about 30 nm.

The AlGaAs emitter passivation layer 6 is a composition gradient layer having a composition of Al$_x$Ga$_{1-x}$As with x=0.3 at its lower surface and x=0 at its upper surface. This layer 6 functions to stop etching and passivate the emitter layer surface as well as to smoothly couple the conduction band of the InGaP first emitter layer 5 to the band structure of the GaAs second emitter layer 7. An impurity concentration of the AlGaAs emitter passivation layer 6 is about $3\times10^{17}$ cm$^{-3}$, and a film thickness thereof is about 30 nm. The GaAs second emitter layer 7 has a gradient impurity concentration of about $3\times10^{17}$ cm$^{-3}$ at the lower surface thereof and of about $3\times10^{18}$ cm$^{-3}$ at the upper surface thereof, and a film thickness thereof is about 300 nm.

The emitter cap layer 8 has two layers including a composition gradient layer having a composition of In$_y$Ga$_{1-y}$As and a thickness of 50 nm and an In$_{0.6}$Ga$_{0.4}$As layer having a thickness of 60 nm. The composition gradient layer has y=0 at its lower surface and y=0.6 at its upper surface. The InGaAs composition gradient layer has an impurity concentration gradient of about $3\times10^{18}$ cm$^{-3}$ at its lower surface and of about $3\times10^{19}$ cm$^{-3}$ at its upper surface. An impurity concentration of the In$_{0.6}$Ga$_{0.4}$As layer is about $3\times10^{19}$ cm$^{-3}$. The band structure from the In$_{0.6}$Ga$_{0.4}$As layer to the InGaP first emitter layer has no large discontinuity and the layers are smoothly coupled.

The impurity concentration of the second emitter layer 7 at its lower surface is the same as that of the first emitter layer 5. The impurity concentration of the second emitter layer 7 at its upper surface is the same as that of the emitter cap layer 8.

It is preferable that p-type impurities of the GaAs base layer 4 are carbon, and n-type impurities of the other layers are silicon. If C is used as p-type impurities, it is preferable to use MOCVD.

Figure 4B:
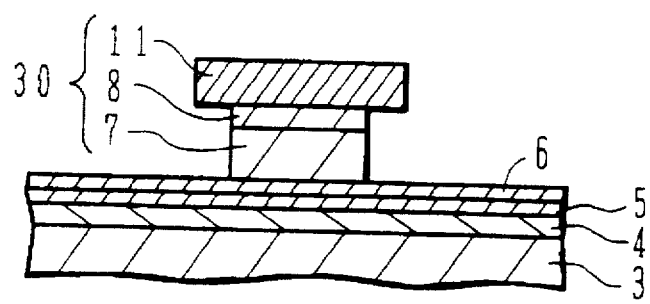

FIG. 4B illustrates a process of forming an emitter mesa. A WSi layer is deposited to a thickness of 400 nm on the surface of the GaAs emitter cap layer 8 by sputtering. The surface of the WSi layer over the emitter region is covered with a resist pattern. The WSi layer is anisotropically etched by using a mixed gas of CF$_4$ and O$_2$ to form an emitter electrode 11.

After the resist pattern is removed, the GaAs emitter cap layer 8 is wet-etched by using the emitter electrode as a mask. As an etchant, a mixed solution of H$_3$PO$_4$, H$_2$O$_2$, and H$_2$O is used.

Next, by using a mixed gas of CCl$_2$F$_2$ and He, the GaAs second emitter layer 7 is isotropically etched. This etching gas does not etch AlGaAs so that the etching automatically stops at the surface of the AlGaAs emitter passivation layer 6. The emitter layer 7 is side-etched by the isotropic etching to form an overhang of the emitter electrode 11. In this manner, an emitter mesa 30 is formed.

Figure 4C:
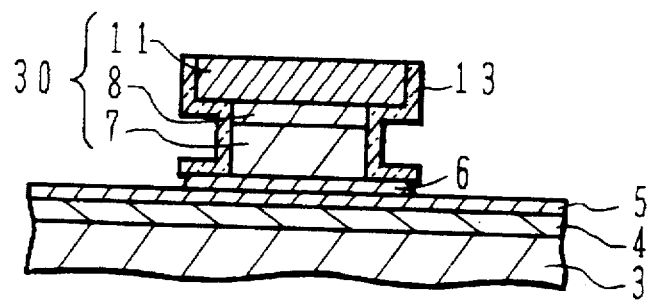

FIG. 4C illustrates a process of forming a side wall on the emitter mesa and etching the emitter passivation layer 6. After the emitter layer 7 is side-etched, an SiN film is formed over the whole surface of the substrate by plasma CVD. Next, the deposited SiN film is anisotropically dry-etched by a mixed gas of CHF$_3$ and CF$_4$ to form a side wall 13.

The anisotropic etching progresses mainly from the upper portion to the lower portion of the substrate. Therefore, the vertical wall of the emitter mesa 30 and the region under the overhang are hardly etched, and the side wall 13 is formed on the emitter mesa 30 over the emitter passivation layer 6.

Next, by using the side wall 13 as a mask, the emitter passivation layer 6 is selectively etched. As an etchant, a mixed solution of H$_3$PO$_4$, H$_2$O$_2$, and H$_2$O is used. This mixed solution hardly etches InGaP so that the etching automatically stops when the surface of the first emitter layer 5 is exposed. Since wet etching progresses isotropically, the emitter passivation layer 6 is undercut and retracted from the end of the side wall 13.

Figure 4D:
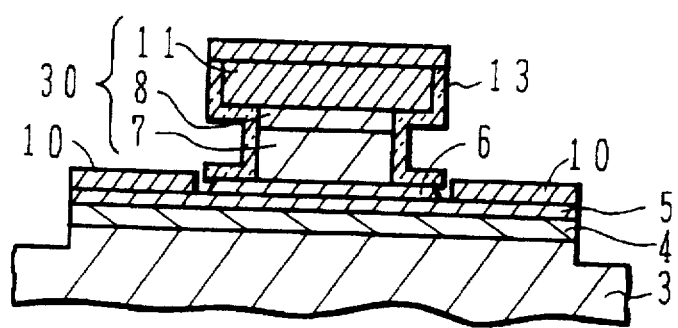

FIG. 4D illustrates a process of forming a base electrode. After the emitter passivation layer is etched, Pd, Zn, Pt, and Au are vapor-deposited in this order to the thicknesses of 20 nm, 20 nm, 40 nm, and 80 nm, respectively. Because the emitter passivation layer 6 has the undercut region, the Pd/Zn/Pt/Au layer does not contact it. For the vapor-deposition of a Pd/Zn/Pt/Au layer, a technique proposed by the present inventors and disclosed in Japanese Patent Application Hei 5-259435 may be used, which is incorporated herein by reference.

Next, the emitter mesa and base electrode region are covered with a resist pattern, and an unnecessary Pd/Zn/Pt/Au layer is removed by argon ion milling. By using the same resist pattern, the first etching layer 5 is etched to expose the surface of the base layer 4, by using a mixed solution of HCl and H$_3$PO$_4$. By using a mixed solution of H$_3$PO$_4$, H$_2$O$_2$, and H$_2$O, the base layer 4 and collector layer 3 are etched. The etching is stopped when the collector layer 3 is etched to a depth of about 150 nm from the interface with the base layer 4. In this manner, the base electrode 10 having an ohmic contact with the base layer 4 is formed around the emitter mesa 30. The resist pattern is then removed. A collector electrode 9 is then formed to complete the HBT shown in FIG. 3. First, a resist pattern having an opening for the collector electrode 9 is formed and the collector layer 3 and collector contact layer 2 are etched by a mixed solution of H$_3$PO$_4$, H$_2$O$_2$, and H$_2$O. The etching is stopped when a hole having a predetermined depth from the surface of the collector contact layer 2 is formed. The collector contact layer 2 is therefore exposed. Next, AuGe, Ni, and Au are vapor-deposited to the thicknesses of 30 nm, 10 nm, and 300 nm, respectively, and the collector electrode 9 is formed by lift-off.

Next, a thermal treatment is performed for 15 minutes at a temperature of 350° C. in a nitrogen atmosphere. This thermal treatment forms an alloy at the region near the interface between the collector contact layer 2 and collector electrode 9 so that an ohmic contact is formed between the collector electrode 9 and collector contact layer 2. At the same time, an electrode reaction region 20 extending from the base electrode 10 to the base layer 4 is formed so that an ohmic contact is formed between the base electrode 10 and base layer 4.

If AuZn, AuBe, AuMn, AuMg or the like is used as the base electrode 10 in order to form an ohmic contact between the base electrode 10 and base layer 4, a reaction between Au and GaAs progresses rapidly at a temperature of about 300° to 350° C. and in many cases the reaction progresses under the base layer 4 having a film thickness of about 100 nm. If the electrode reaction region 20 extends down to the collector layer 3, the collector breakdown voltage is lowered. This problem can be solved by using Pd as the lowest layer in the base electrode 10.

Even when an Au Layer is used in an upper part of the base electrode, reaction of Au with the underlying semiconductor layer can be prevented if the barrier metal, such as Pt, Pd or Mo, interposed between the semiconductor layer and the Au layer is thick enough to render the Au layer non-reactive with the semiconductor layer even after the thermal treatment.

Further, an Au-based alloy layer, such as AuBe, AuZn, or AuMn can be used as the lowermost layer of the base electrode provided that the alloy layer has a sufficiently thin thickness, for example less than 50 nm, and is covered with a barrier layer of Pt, Pd, Mo or the like with a sufficiently thick thickness between the Au alloy layer and the Au upper layer.

Also in the case of the HBT of the second embodiment shown in FIG. 3, the surface of the base layer 4 between the base electrode 10 and emitter mesa 30 is covered with the guard ring 12 of the emitter layer 5. The InGaP emitter layer 5 does not contact the SiN side wall because the surface of the emitter layer 5 is covered with the AlGaAs emitter passivation layer 6. The emitter passivation layer and emitter layer under the side wall insulation film are completely depleted. As a result, similar to the first embodiment shown in FIG. 1, a leak current is reduced, a current gain is raised, and an element performance is stabilized.

A HBT having the structure shown in FIG. 3 was formed and measured. A sufficient base-collector breakdown voltage of 15 V or higher was obtained. No leak current was measured between the emitter and base via the guard ring. Under the application of a bias voltage, it was confirmed that the guard ring was completely depleted.

The results of an aging test of HBTs having the structure shown in FIG. 3 will be described with reference to FIG. 5.

Figure 5:
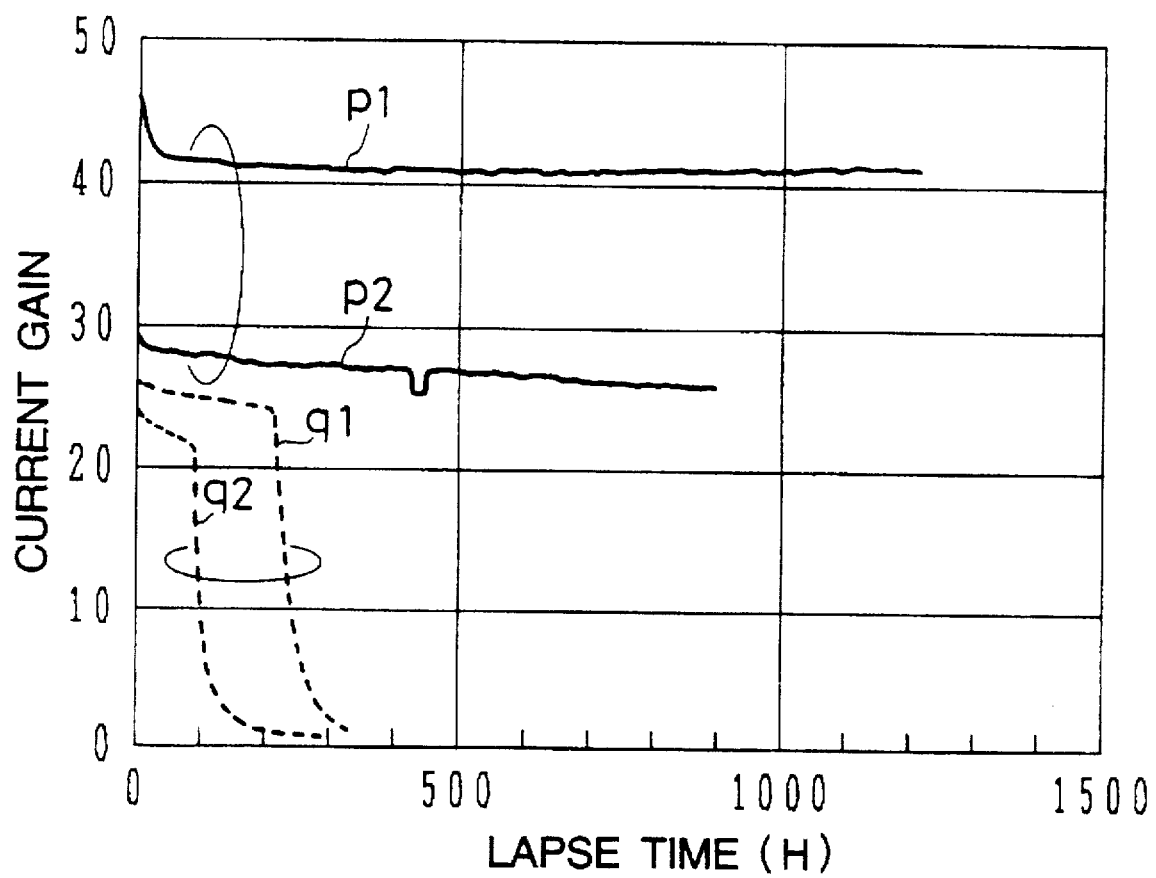
FIG. 5 is a graph showing a time dependent change in the current gain of the HBT of the second embodiment.

FIG. 5 shows a time dependent change in the current gain of HBTs. The abscissa represents a lapse time after power-on, and the ordinate represents a current gain. Solid lines p1 and p2 indicate the time dependent change in the current gains of HBTs having the structure shown in FIG. 3 in an atmosphere at temperatures of 150° C. and 200° C., respectively. For the comparison sake, the time dependent change in the current gains of HBTs having an AlGaAs emitter layer in place of the InGaP emitter layer 5 is shown by broken lines q1 and q2 respectively at temperatures of 150° C. and 200° C. The measurements were made at an emitter current density of $6 \times 10^4$ A/cm$^2$.

As seen from the broken lines q1 and q2, the current gains of HBTs having an AlGaAs emitter layer continued to reduce after the power-on, and abruptly lowered at the lapse time of 100 to 200 hours being unable to operate. From the measurements, a lifetime of HBT under a room temperature operation can be estimated to be about 2 years or shorter even when such an abrupt reduction of the current gain do not occur.

In contrast with this, the current gains of HBTs having an InGaP emitter layer rarely lowered even at a lapse time of 900 hours after the power-on at the temperature of 200° C. and at a lapse time of about 1200 hours at a temperature of 150° C. From this test results, a lifetime of HBT under a room temperature operation can be estimated to be about several years to several tens years. The InGaP emitter layer having a passivated surface can therefore elongate the lifetime of HBT greatly as compared to HBT using AlGaAs.

Although the emitter passivation layer is used as an etching stopper layer, the etching may be controlled by an etching time. The emitter passivation layer is not limited to GaAs or AlGaAs if only it covers the surface of an exposed emitter layer and can passivate the surface of the exposed emitter layer. A layer having such a property may be made of group III–V semiconductor such as GaP, GaAsP, group IV semiconductor such as Si, and the like not containing In. The emitter passivation layer in a current path causes a band discontinuity such as potential barrier. Therefore, a thickness of the emitter passivation film is set to a value allowing carriers to sufficiently transport by tunneling effects or the like, and is preferably 50 nm or less, or more preferably 10 nm or less.

A modification of the second embodiment will be described with reference to FIG. 6.

Figure 6:
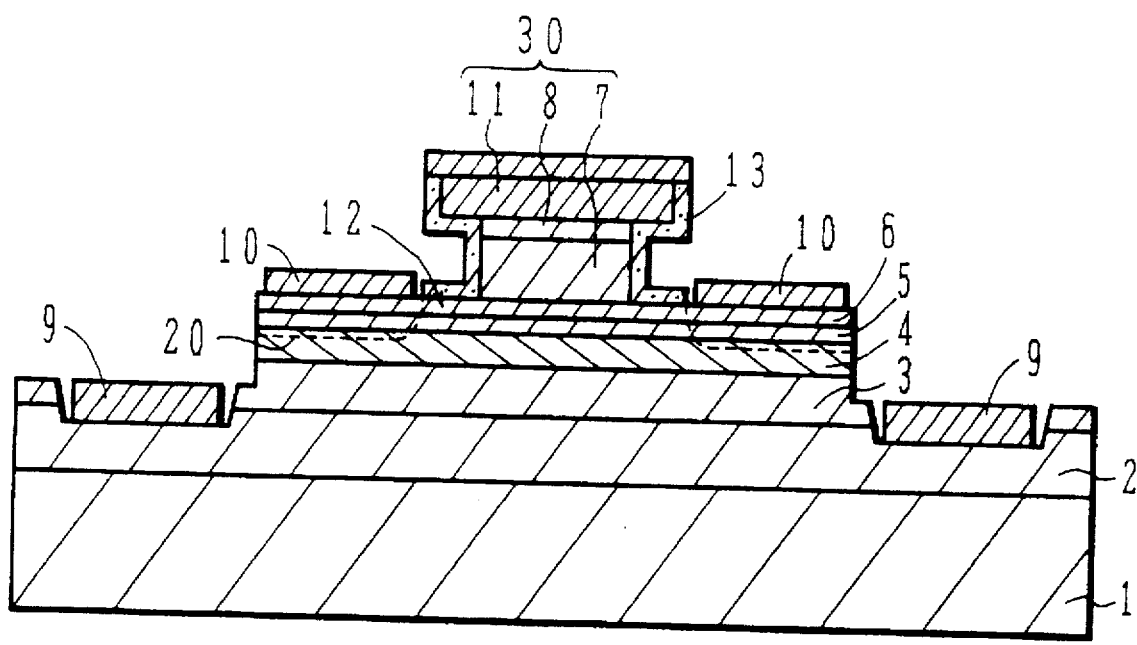
FIG. 6 is a cross sectional view showing a modification of the HBT of the second embodiment.

FIG. 6 is a cross sectional view of an HBT according to a modification of the second embodiment. This modified HBT differs from the second embodiment HBT shown in FIG. 3 in that the emitter passivation layer at the region corresponding to the base electrode is left unremoved. The other structure is the same as the second embodiment.

As shown in FIG. 6, the base electrode 10 is formed on the emitter passivation layer 6, and an electrode reaction region 20 is formed extending from the base electrode to the surface of the base layer 4 via the emitter passivation layer 6 and emitter layer 5. This structure can be realized in the following manner. At the process of the second embodiment illustrated in FIG. 4C, after the side wall 13 is formed, a Pd/Zn/Pt/Au layer is vapor-deposited prior to etching the AlGaAs emitter passivation layer 6.

Also in this modification, the surface of the InGaP first emitter layer 5 is covered with the AlGaAs emitter passivation layer 6. Therefore, there is no problems of a leak current flowing via the surface of the InGaP first emitter layer 5.

In the structure shown in FIG. 6, although the base electrode 10 is connected to the emitter layer 7 via the AlGaAs emitter passivation layer 6, the AlGaAs emitter passivation layer 6 at the region of the guard ring 12 is very thin and is completely depleted throughout the full depth thereof. The AlGaAs emitter passivation layer 6 has a thickness of about 30 nm in the as-deposited state, and is reduced its thickness by the RIE to about 15 nm. Similar to the structure shown in FIG. 3, the InGaP first emitter layer 5 at the region of the guard ring 12 is also completely depleted throughout the full depth thereof. Here, it is preferable to select the total thickness of the AlGaAs emitter passivation layer 6 and the InGaP first emitter layer 5 in the range of 20 to 50 nm. Therefore, current will not flow from the base electrode 10 to the emitter via the AlGaAs emitter passivation layer 6 or InGaP first emitter layer 5.

Further, the emitter passivation layer 6 may also be formed of a laminate, for example of an AlGaAs upper layer and a GaAs lower layer. The GaAs lower layer may be substituted by an InAsP layer or an InGaAsP layer. In this way, the emitter passivation layer may be formed of an AlGaAs layer and another layer formed of GaAs or a material including As as group V element. Also, a laminate of three or more layers can be used. The total thickness of the emitter passivation layer 6 is preferably in the range of from about 5 nm to about 30 nm.

In the embodiments shown in FIGS. 3 to 6, only one HBT is formed on a substrate. If a plurality of semiconductor elements are formed on a single substrate, element separation regions are formed by implanting, for example, proton (H$^+$) ions.

The third embodiment of the invention will be described with reference to FIG. 7.

Figure 7:
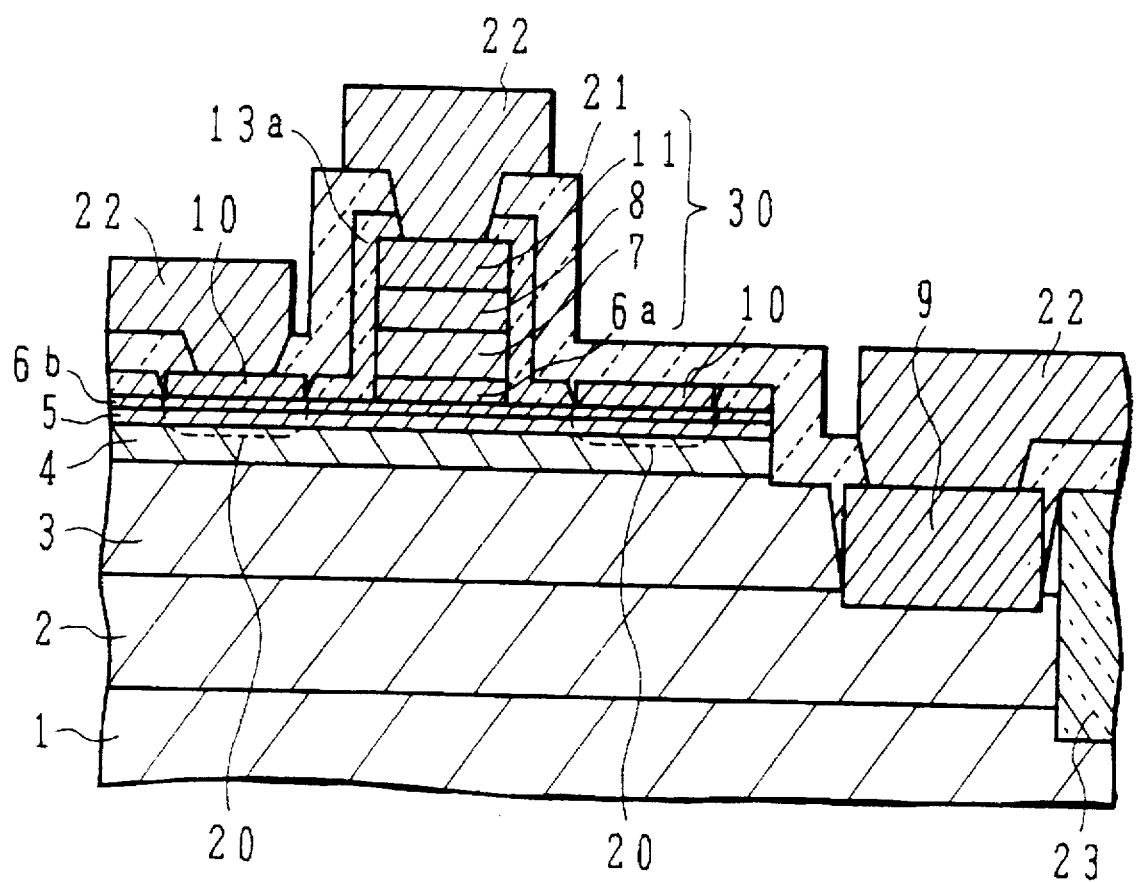
FIG. 7 is a cross sectional view of an HBT according to a third embodiment of the invention.

FIG. 7 is a cross sectional view of an HBT of the third embodiment. In the modification of the second embodiment shown in FIG. 6, the AlGaAs emitter passivation layer 6 functions as an etching stopper layer while the emitter mesa 30 is formed and as a passivation layer for the InGaP first emitter layer. In the third embodiment, both the functions are realized by two separated layers, including an AlGaAs etching stopper layer 6a for stopping etching and a GaAs emitter passivation layer 6b for passivating the surface of the InGaP first emitter layer 5.

In the first and second embodiments shown in FIGS. 1 and 3, the base electrode is formed in a self-alignment manner by using a side wall or an overhand of the emitter electrode. In the third embodiment, a base electrode is formed by using a general mask alignment.

An emitter mesa is a laminated structure of the AlGaAs etching stopper layer 6a, a GaAs second emitter layer 7, an emitter cap layer 8 made of two layers of GaAs and InGaAs, and an emitter electrode 11 in this order from the bottom. The other structure is the same as the modification of the second embodiment shown in FIG. 6. In FIG. 7, an interlevel insulation film 21 covering HBT, and a wiring pattern 22 and element separation region 23 formed over the insulation film 21 are shown.

Next, a method of manufacturing the HBT of the third embodiment will be described with reference to FIGS. 8A to 8D.

Figure 8A:
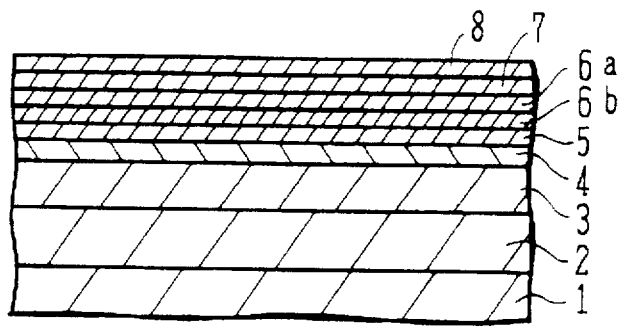
FIGS. 8A to 8D are cross sectional views of the main part of the HBT of the third embodiment, explaining the processes of manufacturing it.

As shown in FIG. 8A, on a semiinsulating GaAs substrate 1, an n$^+$-type GaAs collector contact layer 2, an n-type GaAs collector layer 3, a p$^+$-type GaAs base layer 4, an n-type InGaP first emitter layer 5, an n-type GaAs emitter passivation layer 6b, an n-type AlGaAs etching stopper layer 6a, an n-type GaAs second emitter layer 7, and an n$^+$-type GaAs/InGaAs emitter cap layer 8, are epitaxially formed in this order from the bottom by gas source MBE, MOCVD, or the like.

An impurity concentration of the GaAs collector contact layer 2 is about $3\times10^{18}$ cm$^{-3}$, and a film thickness thereof is about 500 nm. An impurity concentration of the GaAs collector layer 3 is about $3\times10^{16}$ cm$^{-3}$, and a film thickness thereof is about 500 nm. An impurity concentration of the GaAs base layer 4 is about $4\times10^{19}$ cm$^{-3}$, and a film thickness thereof is about 100 nm. An impurity concentration of the InGaP first emitter layer 5 is about $4\times10^{17\ l\ cm-3}$, and a film thickness thereof is about 40 nm.

An impurity concentration of the GaAs emitter passivation layer 6b is about $4\times10^{17}$ cm$^{-3}$, and a film thickness thereof is about 4 nm. An impurity concentration of the AlGaAs etching stopper layer 6a is $4\times10^{17}$ cm$^{-3}$, and a film thickness thereof is about 4 nm. An impurity concentration of the GaAs second emitter layer 7 is about $4\times10^{17}$ cm$^{-3}$, and a film thickness thereof is about 100 nm.

The GaAs/InGaAs emitter cap layer 8 is made of two layers, including a GaAs lower layer and an InGaAs upper layer. An impurity concentration of the GaAs lower layer is about $1\times10^{19}$ cm$^{-3}$, and a film thickness thereof is about 100 nm. An impurity concentration of the InGaAs upper layer is about $3\times10^{19}$ cm$^{-3}$, and a film thickness thereof is about 50 nm.

Figure 8B:
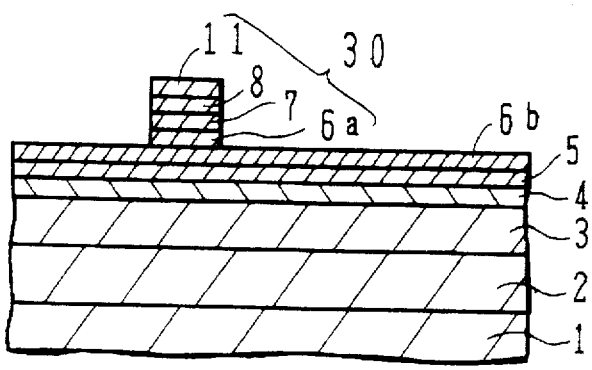

FIG. 8B illustrates a process of forming an emitter mesa 30. An emitter electrode 11 of WSi is formed on the emitter region on the surface of the emitter cap layer 8 by photolithography. Using the emitter electrode 11 as a mask, similar to the process illustrated in FIG. 2A, the InGaAs emitter cap layer 8 is wet-etched, and then the GaAs emitter layer 7 is dry-etched. The etching automatically stops when the surface of the AlGaAs etching stopper layer 6a is exposed.

Next, the AlGaAs etching stopper layer 6a is etched. In the above manner, the emitter mesa 30 is formed.

Figure 8C:
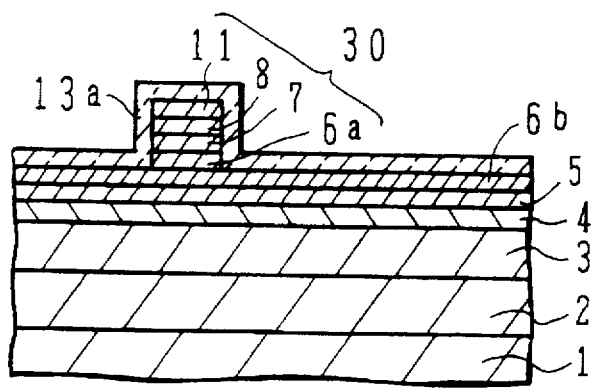

As shown in FIG. 8C, a surface passivation film 13a such as SiO$_2$ is deposited on the whole surface of the substrate, covering the emitter mesa 30.

Figure 8D:
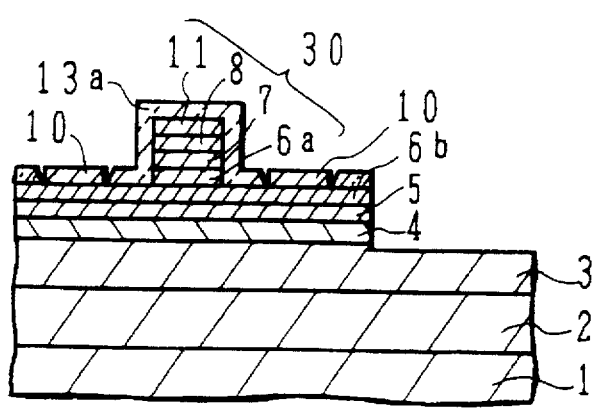

As shown in FIG. 8D, an opening is formed at a base electrode region of the surface passivation film 13a by using a resist pattern having an opening at the base electrode region, to thereby expose the surface of the GaAs emitter passivation layer 6b. Next, a Pd/Zn/Pt/Au layer is vapor-deposited over the whole surface of the substrate, and a base electrode 10 is formed by lift-off.

After the base electrode 10 is formed, a collector electrode 9 is formed by processes similar to the processes after the formation of the base electrode illustrated in FIG. 4D. Thereafter, an interlevel insulation film 21 is deposited over the whole surface of the substrate. Contact holes are formed in the interlevel insulation film 21 at the regions corresponding to the emitter, base, and collector electrodes. Next, a wiring pattern 22 is formed on the interlevel insulation film 21 by plating, vapor-deposition, or the like.

An element separation region 23 is formed by implanting, for example, proton ions.

In the structure shown in FIG. 7 and FIGS. 8A to 8D, a Pd/Zn/Pt/Au alloy electrode is used for obtaining an ohmic contact between the base electrode and base layer. An ohmic contact may be obtained by diffusing, for example, Zn, or by implanting, for example, Be ions, into the electrode reaction region 20. The base electrode 10 may be formed directly on the base layer 4 as shown in FIG. 1, by removing the GaAs emitter passivation layer 6b and InGaP emitter layer 5 at the base electrode forming region.

Next, a modification of the third embodiment will be described with reference to FIG. 9.

Figure 9:
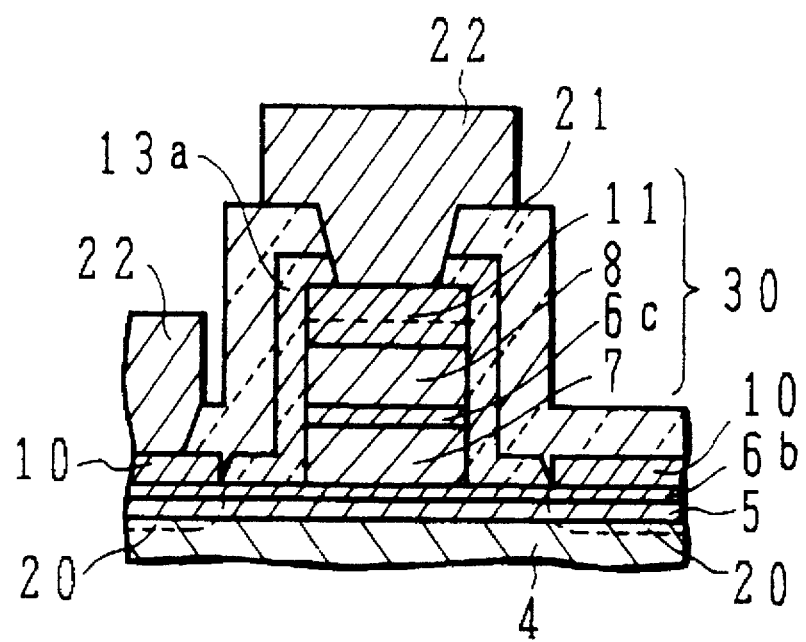
FIG. 9 is a cross sectional view showing a modification of the HBT of the third embodiment.
Figure 10A:
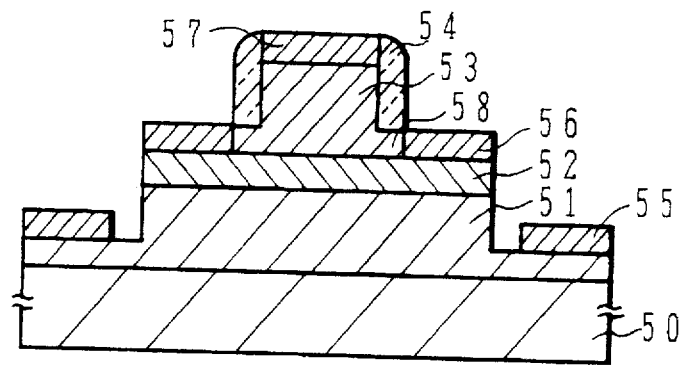
FIGS. 10A to 10C are cross sectional views of conventional HBTs.
Figure 10B:
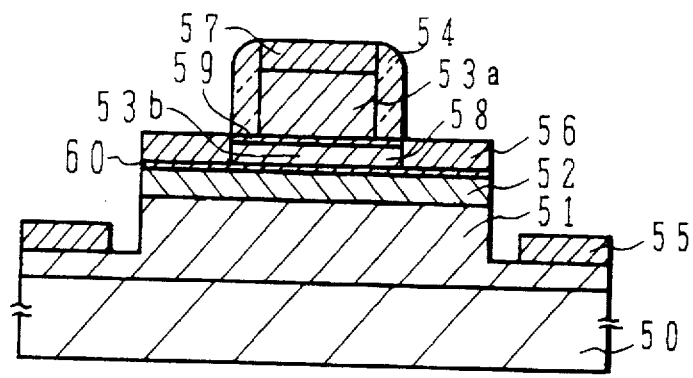
Figure 10C:
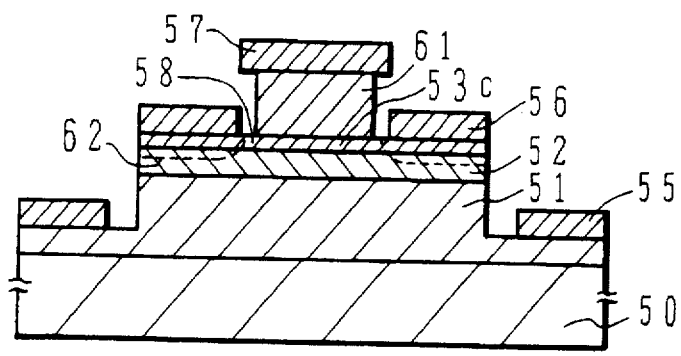

FIG. 9 is a cross sectional view of an emitter mesa of an HBT according to the modification of the third embodiment. This modified HBT has a laminated structure of an emitter mesa 30, constituted by an InGaP second emitter layer 7, an AlGaAs etching stopper layer 6c, an emitter cap layer 8 made of two layers of GaAs and InGaAs, and an emitter electrode. This laminated structure is different from the third embodiment and the other structure is the same as the third embodiment.

An impurity concentration of the InGaP second emitter layer 7 is about $4\times10^{17}$ cm$^{-3}$, and a film thickness thereof is about 40 nm. The AlGaAs etching stopper layer 6c is a composition gradient layer having a composition of Al$_x$Ga$_{1-x}$As with x=0.3 at its lower surface and x=0 at its upper surface. An impurity concentration of the AlGaAs etching stopper layer 6c is $4\times10^{17}$ cm$^{-3}$, and a film thickness thereof is about 30 nm.

An impurity concentration of the GaAs lower layer of the emitter cap layer 8 is about $4\times10^{19}$ cm$^{-3}$, and a film thickness thereof is about 100 nm. The InGaAs lower layer of the emitter cap layer 8 has a composition of In$_{0.6}$Ga$_{0.4}$As, an impurity concentration thereof is about $3\times10^{19}$ cm$^{-3}$, and a film thickness thereof is about 50 nm.

Next, a method of forming the HBT of this modification will be described. The process of forming an emitter mesa is different from the third embodiment illustrated in FIG. 8B, and the other processes are the same as the third embodiment. Only the process of forming an emitter mesa will be described.

First, by using the emitter electrode 11 formed on the emitter cap layer 8 as a mask, the InGaAs upper layer of the emitter cap layer 8 is wet-etched. Then, the GaAs lower layer of the emitter cap layer 8 is selectively dry-etched.

Next, the AlGaAs etching stopper layer 6c is selectively wet-etched to expose the surface of the InGaP second emitter layer 7. The InGaP second emitter layer 7 is selectively wet-etched to expose the surface of the GaAs emitter passivation layer 6b.

The above etching processes are stopped automatically when the surface of the underlying layer is exposed, in order not to etch the underlying layer.

After the surface of the GaAs emitter passivation layer 6b is exposed, similar processes to those illustrated in FIGS. 8C and 8D of the third embodiment are performed to complete the HBT.

According to this modification, the relatively thick second emitter layer on the emitter passivation layer is wet-etched. It is therefore possible to suppress damages in the guard ring to be caused by dry etching. The emitter cap layer 8 is formed by dry etching. Dry etching has generally a higher anisotropy than wet etching. Therefore, the cross section of the emitter mesa can be controlled precisely, thereby reducing element performance variation.

Since the AlGaAs etching stopper layer 6c is a composition gradient layer, adverse effects by spikes in a conduction band can be alleviated.

Next, the HBT according to the fourth embodiment of the invention will be described with reference to FIG. 12 and FIGS. 13A to 13D.

Figure 12:
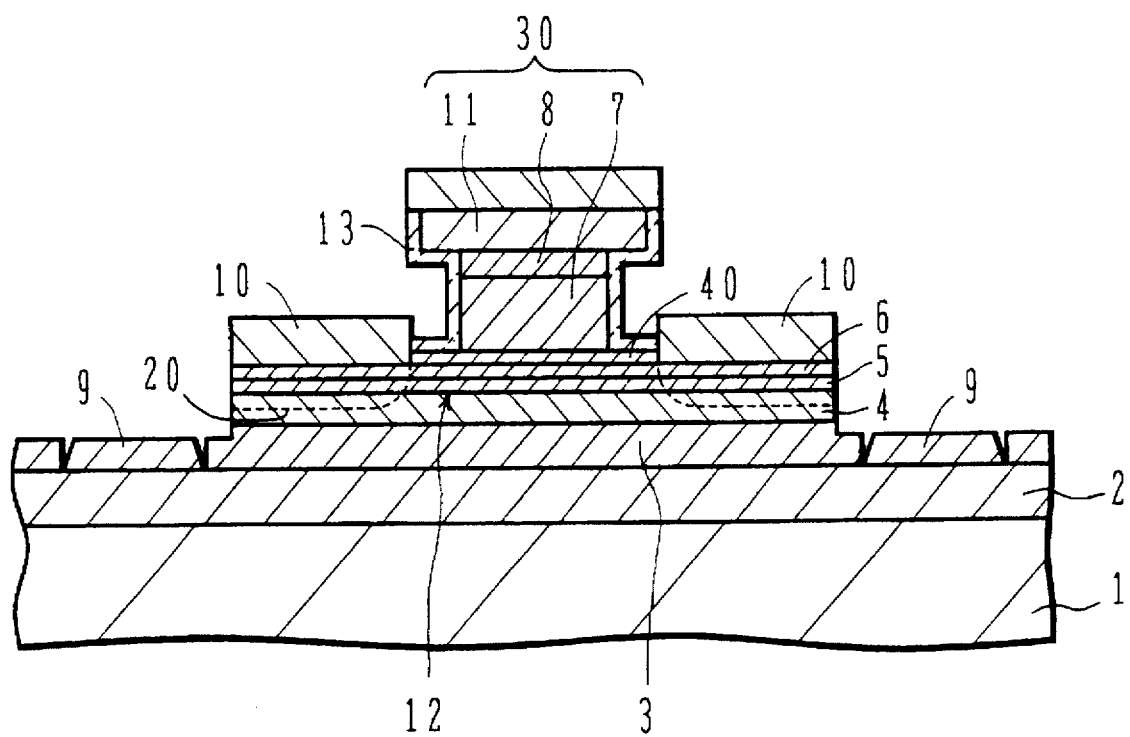
FIG. 12 is a cross sectional view of an HBT according to a fourth embodiment of the invention.

FIG. 12 is a cross sectional view of the HBT of the fourth embodiment. In the second embodiment shown in FIG. 3, the second emitter layer 7 is formed directly on the AlGaAs emitter passivation layer 6. In the HBT of this fourth embodiment, a third emitter layer 40 is formed between the emitter passivation layer 6 and second emitter layer 7. The other structures are similar to those shown in FIG. 3 except different composition, film thickness, and impurity concentration of each layer.

The method of manufacturing an HBT according to the fourth embodiment will be described with reference to FIGS. 13A to 13D, paying attention to different points from the HBT manufacturing method of the second embodiment illustrated in FIGS. 4A to 4D.

Figure 13A:
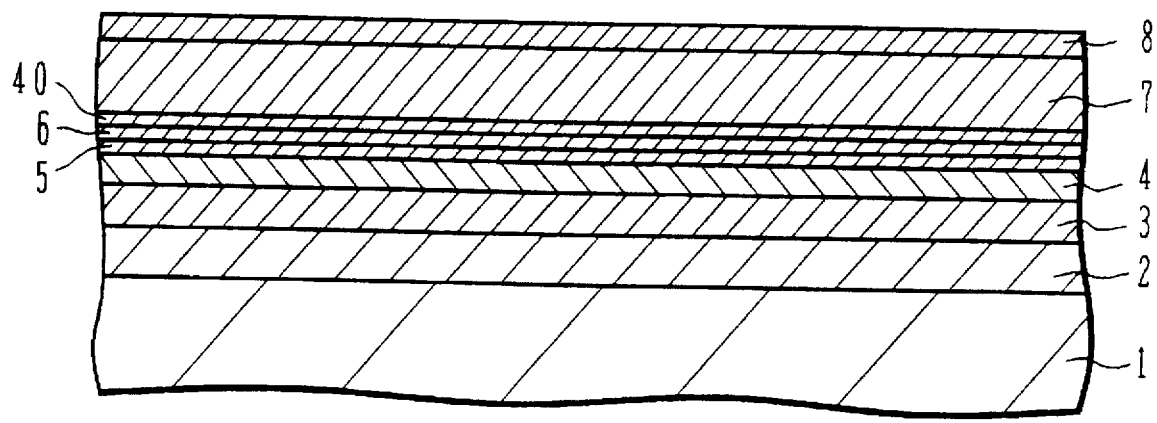
FIGS. 13A to 13D are cross sectional views of the main part of the HBT of the fourth embodiment, explaining the processes of manufacture.

FIG. 13A is a cross sectional view of a laminate structure corresponding to that of the second embodiment shown in FIG. 4A. Although n-type AlGaAs is used as the material of the emitter passivation layer 6 in FIG. 4A, n-type GaAs is used as the material of the emitter passivation layer 6 in FIG. 13A. In addition, although the n-type GaAs second emitter layer 7 is formed directly on the emitter passivation layer 6 in FIG. 4A, an n-type InGaP third emitter layer 40 is formed on the emitter passivation layer 6 and an n-type GaAs second emitter layer 7 is formed on the n-type InGaP third emitter layer 40 in FIG. 13A.

In FIG. 4A, the two-layer structure of the InGaAs composition gradient layer and $In_{0.6}Ga_{0.4}As$ layer is used as the emitter cap layer 8, whereas in FIG. 13A an n-type InGaAs layer is used having an impurity concentration of $\times 10^{18}$ $cm^{-3}$ and a film thickness of 100 nm.

The emitter passivation layer 6 has an impurity concentration of $3\times 10^{17}$ $cm^{-3}$ and a film thickness of 5 nm. The third emitter layer 40 has an impurity concentration of $3\times 10^{17}$ $cm^{-3}$ and a film thickness of 10 nm. The other layers have similar structures to the laminate structure shown in FIG. 4A.

Figure 13B:
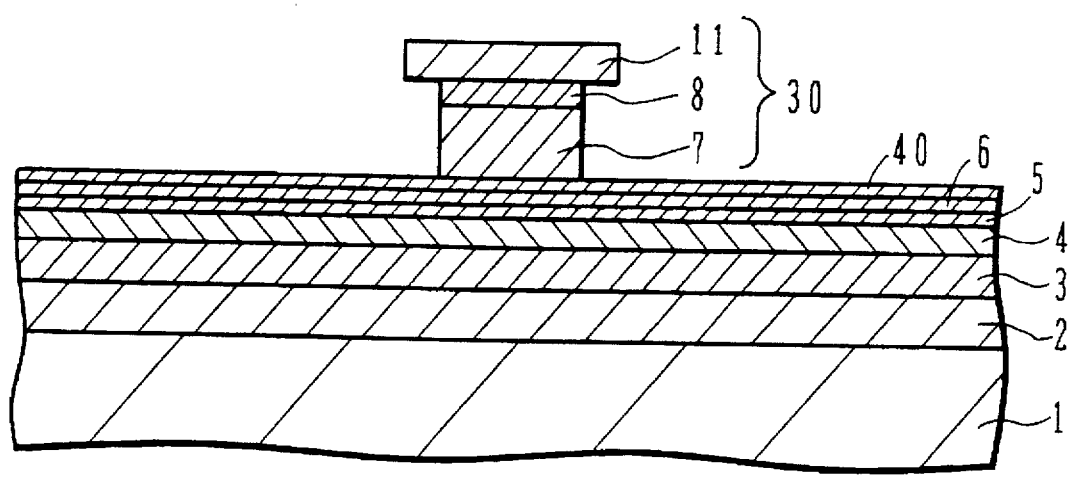

FIG. 13B corresponds to FIG. 4B of the second embodiment. The emitter cap layer 8 may be etched by a mixed solution of $H_3PO_4$, $H_2O_2$, and $H_2O$, similar to the embodiment shown in FIG. 4B. Although as the etching gas for etching the emitter layer 7 of the embodiment shown in FIG. 4B, a mixed gas Of $CCl_2F_2$ and He is used, in the embodiment shown in FIG. 13B a mixed gas of $CF_4$ and $SiCl_4$ is used for selectively stopping the etching at the surface of the third emitter layer 40 made of InGaP. In this manner, the emitter mesa 30 is formed.

Figure 13C:
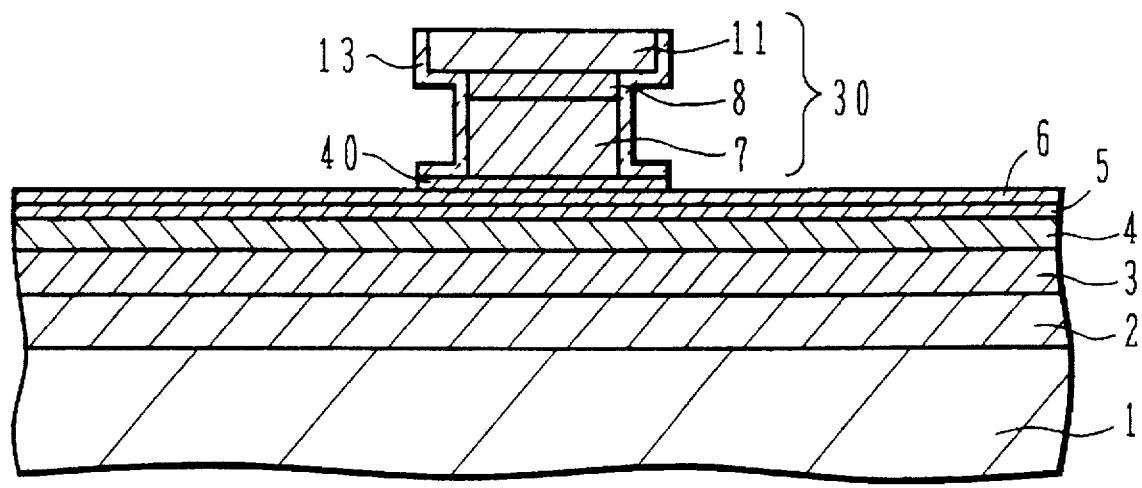

FIG. 13C corresponds to FIG. 4C of the second embodiment. The emitter passivation film 6 is etched by using the side wall 13 as a mask in the embodiment of FIG. 4C, whereas the third emitter layer 40 is etched by using the side wall 13 as a mask in the embodiment of FIG. 13C. Different from the second embodiment, the emitter passivation layer 6 is left over the whole upper area of the first emitter layer 5.

The third emitter layer 40 made of InGaP is etched, for example, by HCl. As the third emitter layer 40 is etched, the surface of the emitter passivation layer 6 is partially exposed. During this etching process, the third emitter layer 40 is side-etched and retracted inward from the end portion of the side wall 13.

Figure 13D:
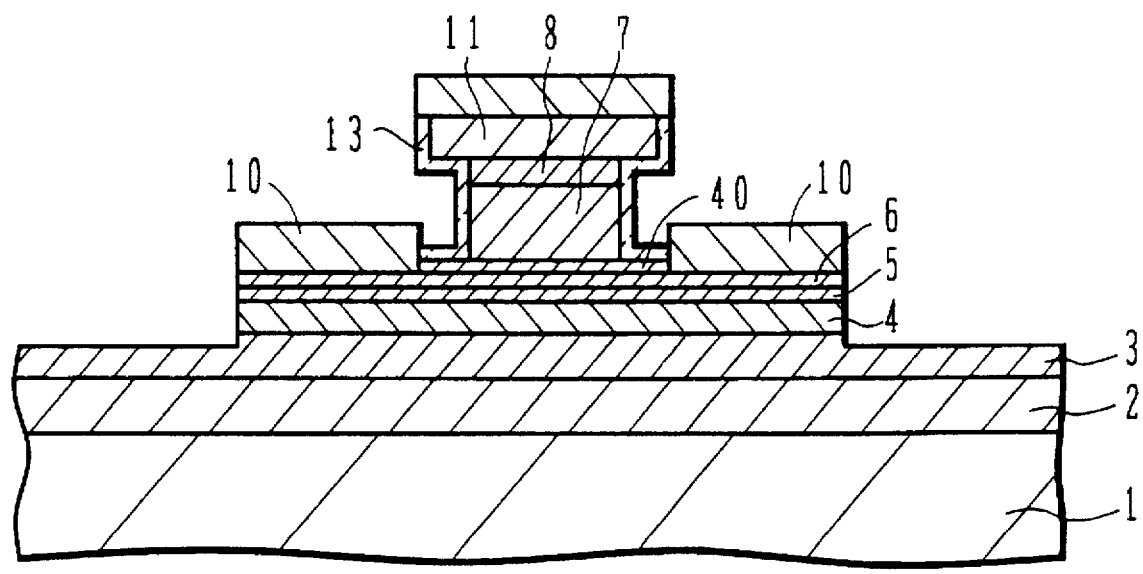

FIG. 13D corresponds to FIG. 4D of the second embodiment. The base electrode 10 is formed in the similar manner described with FIG. 4D. By using the same resist pattern used for forming the base electrode 10 as a mask, the upper layers of the emitter passivation layer 6, first emitter layer 5, base layer 4, and collector layer 3 are etched about 100 nm thick. The emitter passivation layer 6, base layer 4, and collector layer 3 each made of GaAs are etched by a mixed solution of $H_3PO_4$, $H_2O_2$, and $H_2O$. The first emitter layer 5 made of InGaP is etched by a mixed solution of HCl and $H_3PO_4$.

In the above manner, the HBT having the structure shown in FIG. 12 is fabricated.

In the HBT of the fourth embodiment, the emitter passivation layer 6 prevents the surface of the first emitter layer 5 from being oxidized, so that conductive indium oxide is suppressed from being formed on the surface of the first emitter layer 5. Although there is a possibility that indium oxide is formed on the exposed surface of the third emitter layer 40, this indium oxide will not electrically connect the base electrode 10 and the emitter layer 7 because the third emitter layer 40 is spaced apart from the base electrode 10.

The laminate of InGaP/GaAs/InGaP constituting the emitter layer 7, emitter passivation layer 6, and first emitter layer 5 present at the region between the emitter layer 7 and base electrode 10 functions as a guard ring layer 12 for guarding the base layer 4 as shown in FIG. 12.

In the above processes, the third emitter layer 40 constituting the uppermost portion of the guard ring layer 12 is used as the etching stop layer. Therefore, the thickness of the guard ring layer 12 can be easily controlled and the manufacture yield is improved. Moreover, since the third emitter layer 40 functioning as the etching stop layer is left between the emitter region and the base electrode 10, a process of removing the third emitter layer 40 prior to forming the SiN film 13 can be dispensed with so that throughput can be improved.

During the process of etching the third emitter layer 40 between the emitter region and base electrode 10, etchant may etch the emitter passivation layer 6 and also the first emitter layer 5.

However, in the region protecting the base layer 4, the emitter passivation layer 6 formed between the first and third emitter layers 5 and 40 is not exposed. Therefore, the emitter passivation layer 6 is not damaged nor over-etch is performed.

Further, since in the region between the emitter mesa 30 and base electrode 10, the emitter passivation layer 6 is interposed between the first and third emitter layers 5 and 40 serving as the base protection layer, the base protection can be stabilized and a stable current gain is ensured for a long period of time.

Still further, the first emitter layer 5 and emitter passivation layer 6 are very thin, respectively 30 nm thick and 5 nm thick. Therefore, they are depleted at the region between the emitter region and base electrode 10, and the base electrode 10 and second emitter layer 7 will not be electrically connected.

The reliability of the HBT formed by the above processes was tested and the following results were obtained.

The time dependent change in the current gain of the HBT was measured while maintaining the emitter current density constant at $6\times10^4$ A/cm$^2$ in an atmosphere of 250° C. The life time of the HBT was 500 hours or longer. The junction temperature of the HBT at an ambient temperature of 250° C. exceeds 300° C. Even under this severe condition, the HBT operated stably indicating a sufficient operation stability.

Figure 14A:
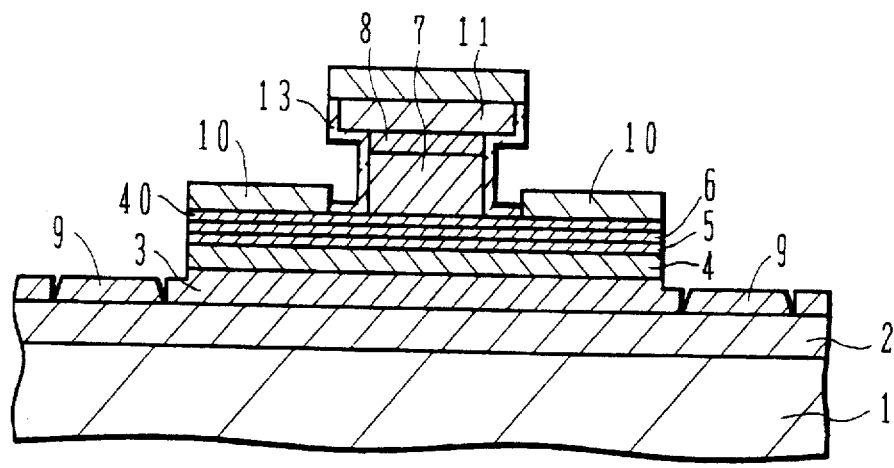
FIGS. 14A to 14C are cross sectional views of HBT's according to the embodiments modified from the fourth embodiment.
Figure 14B:
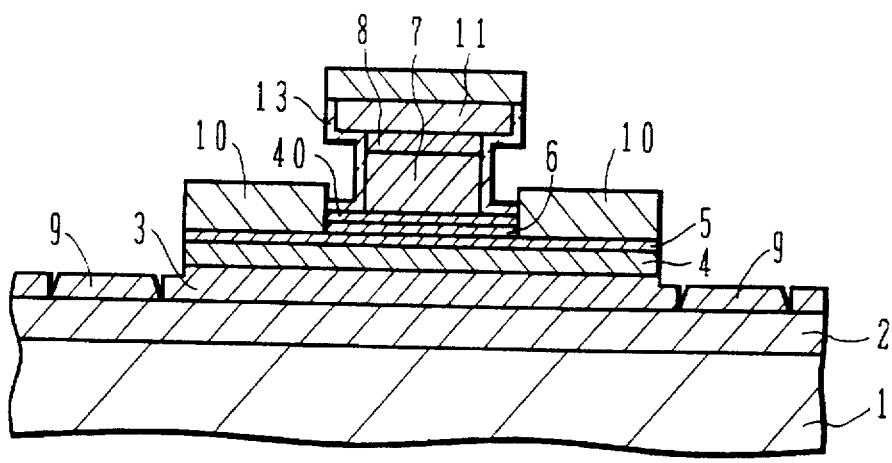
Figure 14C:
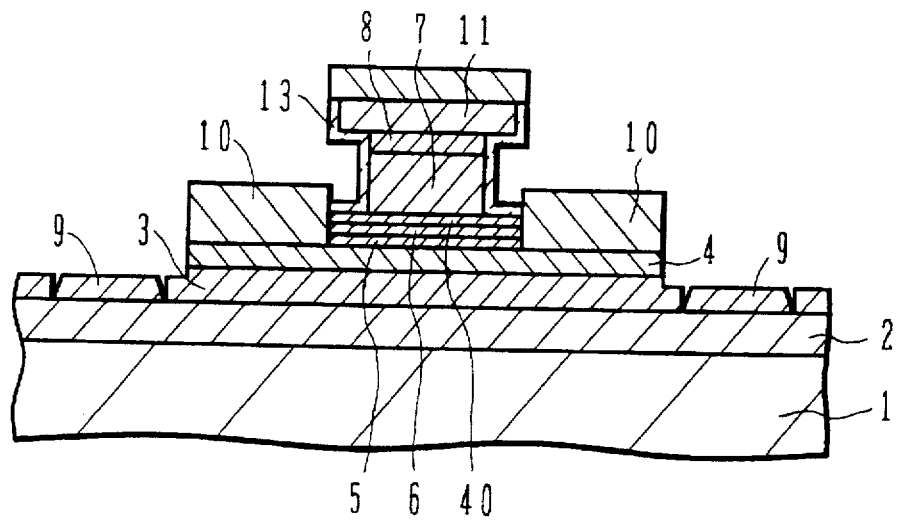

The base electrode 10 of the fourth embodiment is formed on the emitter passivation layer 6 at the region where the third emitter layer 40 was removed. As shown in FIGS. 14A to 14C, the base electrode 10 may be formed directly contacting the third emitter layer 40, or contacting the first emitter layer 5 or base layer 4.

In forming the base electrode on the third emitter layer 40, since the total thickness of the first emitter layer 5, emitter passivation layer 6, and third emitter layer 40 is very thin and 45 nm thick, they are depleted. Therefore, current will not flow from the base electrode 10 to the emitter layer 7 through the first emitter layer 5, emitter passivation layer 6, and third emitter layer 40.

In the fourth embodiment, an SiN film is used as the side wall. Other insulating materials such as SiO$_2$ may be used, or the side wall may not be formed.

Instead of an i-type collector layer, an n- or p-type collector layer may be used. The collector structure is not limited only to the embodiment collector structure.

In the fourth embodiment, the base layer is made of GaAs. In such a case, the emitter passivation layer 6 may be made of AlGaAs, and the first and third emitter layers 5 and 40 may be made of AlInGaP. If the base layer is made of InGaAs, the emitter passivation layer 6 may be made of material not containing In such as GaAs, and the first and third emitter layers 5 and 40 may be made of InP. The first emitter layer and emitter passivation layer are preferably made of the materials which realize lattice matching.

In the second to fourth embodiments, a Pd/Zn/Pt/Au layer is used as the base electrode. Other electrode materials not containing Au in the lowest layer may be used, such as Pt/Ti/Pt/Au, Ti/Pt, and Ti/Pt/Au laminated electrodes.

Further, an alloy layer of such as AuZn, AuMn, AuBe, and AuMg or a laminate including one of these alloy layers such as AuZn/Mo/Au, AuZn/Pt/Au, AuMn/Mo/Au and AuMn/Pt/Au may also be used, provided that the quantity of Au reactive with the underlying semiconductor layer is limited.

Figure 11:
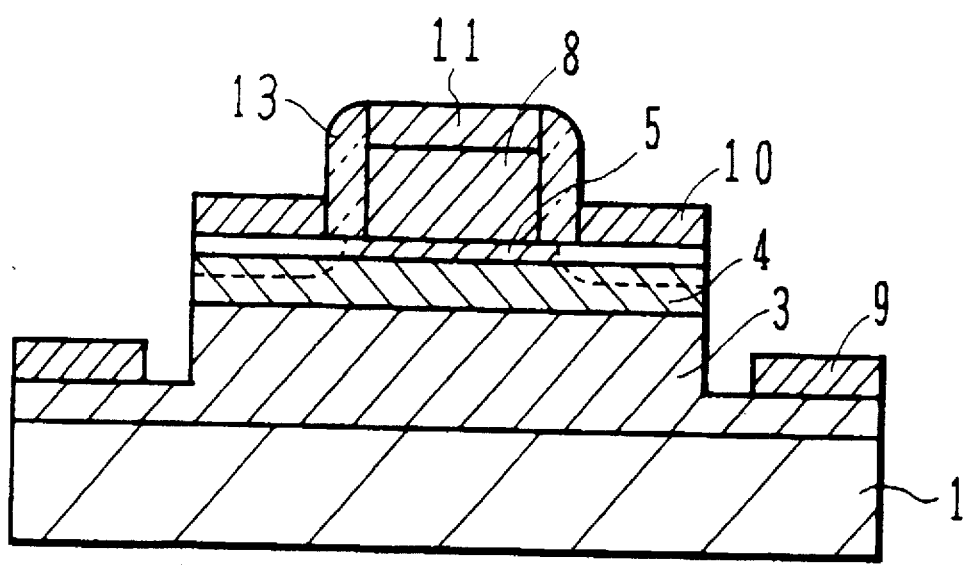
FIG. 11 is a cross sectional view of an HBT according to another embodiment of the invention.

FIG. 11 shows another embodiment. On an n-type GaAs substrate, an n-type GaAs collector layer 8, an P-type GaAs base layer 4, an n-type InGaP first emitter layer 5, and an n-type GaAs second emitter layer 8 are epitaxially grown. A mesa structure is formed of the second emitter layer 8. A WSi emitter electrode 11 is formed on the second emitter layer 8. A gate electrode 10 is formed on the first emitter layer 5 and made of a laminate of Pd/Zn/Pt/Au or other laminate which includes a lower reactive layer or layers containing Pd, Pt, Ni, or the like and not containing Au. In this embodiment, there is no emitter passivation layer.

If the reaction portion of the gate electrode contains Au, the Au component can well react with the semiconductor base layer and can easily penetrate through the base layer. When Au is replaced with Pd or other barrier metal, the reactivity with the semiconductor is significantly reduced to prevent the penetration of the alloyed region.

In the second to fourth embodiments, the electrode reaction region extends from the base electrode to the base layer via the emitter layer. It is not always required to make the electrode reaction region directly contact the base layer. For example, even if the reaction stops at the midst of the InGaP first emitter region and the electrode reaction region does not directly contact the surface of the base layer, it is sufficient if a distance between the lower surface of the electrode reaction region and the upper surface of the base layer allows hole tunnel current to flow.

In the first to fourth embodiments, InGaP is used as the emitter layer. A mixed crystal semiconductor containing In, Ca, P may be used. For example, materials having a lattice match with the base layer may be used, such as InCaAsP and InCaAlP.

In the above embodiments, an emitter-up type HBT has been described. A similar structure may be applied to a collector-up type HBT. The structure is applicable not only to an npn type transistor but also to a pnp type transistor.

A layer providing both the etching stopper function and the emitter passivation function has preferably a thickness of about 50 nm or less in both the cases of a single layer and a laminated layer, from the viewpoint of electrical characteristics. If a uniform composition layer not a composition gradient layer is used, it is preferable to set the total thickness to be about 10 nm or less.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A heterojunction bipolar semiconductor device comprising:

a support substrate;

a collector layer formed on said support substrate and made of group III–V compound semiconductor;

a base layer formed on said collector layer and made of group III–V compound semiconductor containing arsenic as group V element;

a first emitter layer formed on said base layer and made of group III–V compound semiconductor containing phosphorous as group V element, said first emitter layer having a band gap wider than said base layer:

an emitter passivation layer formed on said first emitter layer and made of semiconductor having a function of passivating the surface of said first emitter layer, said emitter passivation layer being of a semiconductor material which does not change to an electrically conductive material if oxidized; and a base electrode forming an ohmic contact with said base layer, wherein:

whole upper surface of said base layer is covered with said first emitter layer or with said first emitter layer and said base electrode;

whole upper surface of said first emitter layer is substantially covered with said emitter passivation layer or with said emitter passivation layer and said base electrode; and a region of said first emitter layer adjacent to an edge of said base electrode is depleted throughout a full depth thereof.

2. A heterojunction bipolar semiconductor device according to claim 1, wherein said emitter passivation layer is made of group III–V compound semiconductor containing arsenic as group V element.

3. A heterojunction bipolar semiconductor device according to claim 1, further comprising:

a second emitter layer formed on said emitter passivation layer and made of group III–V compound semiconductor electrically connected at least to said first emitter layer via said emitter passivation layer; and an emitter cap layer formed on said second emitter layer and made of group III–V compound semiconductor having an impurity concentration higher than said second emitter layer.

4. A heterojunction bipolar semiconductor device according to claim 3, wherein said base electrode is directly formed on a surface of said base layer.

5. A heterojunction bipolar semiconductor device according to claim 4, further comprising:

a side wall member formed on side surfaces of said second emitter layer and said emitter cap layer and made of insulating material, and having an outer periphery registered with an edge of said emitter passivation film.

6. A heterojunction bipolar semiconductor device according to claim 3, wherein said base electrode is formed on said first emitter layer and forms an ohmic contact with said base layer via said first emitter layer.

7. A heterojunction bipolar semiconductor device according to claim 6, wherein a region of said first emitter layer corresponding to said base electrode includes an alloy region containing palladium or platinum, which electrically connects said base electrode to said base layer.

8. A heterojunction bipolar semiconductor device according to claim 6, wherein a region of said first emitter layer corresponding to said base electrode includes a region doped with at least one selected from the group consisting of zinc, beryllium, carbon, magnesium and manganese, which electrically connects said base electrode to said base layer.

9. A heterojunction bipolar semiconductor device according to claim 8, wherein said base electrode is formed on said emitter passivation layer and forms an ohmic contact with said base layer via said emitter passivation layer and said first emitter layer.

10. A heterojunction bipolar semiconductor device according to claim 9, wherein a region of said first emitter layer and said emitter passivation layer corresponding to said base electrode includes an alloy region containing palladium or platinum, which electrically connects said base electrode to said base layer.

11. A heterojunction bipolar semiconductor device according to claim 9, wherein a region of said first emitter layer and said emitter passivation layer corresponding to said base electrode includes a region doped with at least one selected from the group consisting of zinc, beryllium, carbon, magnesium and manganese, which electrically connects said base electrode to said base layer.

12. A heterojunction bipolar semiconductor device according to claim 6, further comprising:

an emitter electrode formed on said emitter cap layer, said emitter electrode having a region extending outward from an end of said second emitter and has a different etch resistance from said second emitter layer and said emitter cap layer, and wherein an end of said base electrode on the side of said second emitter layer is substantially registered with an end of said emitter electrode in a plane of the base layer.

13. A heterojunction bipolar semiconductor device according to claim 12, further comprising;

a side wall member made of insulating material and formed on side surfaces of said emitter electrode, said emitter cap layer, and said second emitter layer and on the surface region of said emitter passivation layer between an end of said second emitter layer and the end of said base electrode.

14. A heterojunction bipolar semiconductor device according to claim 3, wherein said emitter passivation layer and said second emitter layer have a different etch resistance.

15. A heterojunction bipolar semiconductor device according to claim 14, wherein said first emitter layer further contains at least In and Ga as group III element.

16. A heterojunction bipolar semiconductor device according to claim 15, wherein said first emitter layer is InGaP.

17. A heterojunction bipolar semiconductor device according to claim 15, wherein said first emitter layer is InCaAsP or InCaAlP.

18. A heretojunction bipolar semiconductor device according to claim 14, wherein said second emitter layer contains In and Ga as group III element and P as group V element and said emitter passivation layer is GaAs or AlGaAs.

19. A heterojunction bipolar semiconductor device according to claim 14, wherein said second emitter layer is GaAs and said emitter passivation layer is AlGaAs.

20. A heterojunction bipolar semiconductor device according to claim 14, further comprising an etching stopper layer formed between said second emitter layer and said emitter cap layer, said etching stopper layer having an etch resistance different from said second emitter layer and said emitter cap layer.

21. A heterojunction bipolar semiconductor device according to claim 20, wherein said emitter cap layer contains at least GaAs and said etching stopper layer is AlGaAs.

22. A heterojunction bipolar semiconductor device according to claim 3, wherein said emitter passivation layer and said second emitter layer have same etch resistance, and the device further comprises an etching stopper layer formed between said emitter passivation layer and said second emitter layer, said etching stopper layer having a different etch resistance from said emitter passivation film and said second emitter layer.

23. A heterojunction bipolar semiconductor device according to claim 22, wherein said first emitter layer further contains at least In and Ga as group III element.

24. A heterojunction bipolar semiconductor device according to claim 23, wherein said first emitter layer is InGaP, InCaAsP, or InCaAlP.

25. A heterojunction bipolar semiconductor device according to claim 22, wherein said second emitter layer and said emitter passivation layer are GaAs and said etching stopper layer is AlGaAs.

26. A method of manufacturing a heterojunction bipolar semiconductor device comprising the steps of:

preparing a semiconductor substrate having a multilayer structure including a base layer made of group III–V compound semiconductor containing arsenic as group V element, a first emitter layer made of group III-V compound semiconductor containing phosphorus as group V element, an emitter passivation layer made of group III-V compound semiconductor containing arsenic as group V element, and a second emitter layer made of group III-V compound semiconductor containing phosphorus as group V element, formed in this order from the bottom;

partially etching said second emitter layer, stopping etching on a surface of said emitter passivation layer, to form a mesa;

forming a side wall member of insulating material on side surface of said mesa of said second emitter layer;

etching said emitter passivation layer by using said side wall member as a mask;

partially etching said first emitter layer to expose a surface of said base layer, by using said side wall member and said emitter passivation layer as a mask; and forming a conductive film on the exposed surface of said base layer.

27. A method of manufacturing a heterojunction bipolar semiconductor device comprising the steps of:

preparing a semiconductor substrate having a multilayer structure including a base layer made of group III-V compound semiconductor containing arsenic as group V element, a first emitter layer made of group III-V compound semiconductor containing phosphorus as group V element, an emitter passivation layer made of group III-V compound semiconductor containing arsenic as group V element, a second emitter layer made of group III-V compound semiconductor having a different etch resistance from said emitter passivation layer, and an emitter electrode layer having a different etch resistance from both said emitter passivation layer and said second emitter layer, formed in this order from the bottom;

partially etching said emitter electrode layer to form an emitter electrode;

etching said second emitter layer to expose a surface of said emitter passivation layer and side-etching said second emitter layer to form an overhang of said emitter electrode extending outward from an edge of said second emitter layer, by using said emitter electrode as a mask;

isotropically forming an insulation film on exposed surfaces of said emitter electrode, said second emitter layer, and said emitter passivation layer;

anisotropically etching said insulation film to form a side wall member on a side surface and a partial bottom surface of said emitter electrode, on a side surface of said second emitter layer, and on a surface of said emitter passivation layer beneath said overhang of said emitter electrode;

etching said emitter passivation layer to expose a surface of said first emitter layer by using said side wall as a mask;

forming a conductive film on the exposed surface of said first emitter layer; and performing a thermal treatment to form an alloy region in said first emitter layer at a region corresponding to said conductive film, said alloy region forming an ohmic contact of said conductive film with said base layer.

28. A method of manufacturing a heterojunction bipolar semiconductor device comprising the steps of:

preparing a semiconductor substrate having a multilayer structure including a base layer made of group III-V compound semiconductor containing arsenic as group V element, a first emitter layer made of group III-V compound semiconductor containing phosphorus as group V element, an emitter passivation layer made of group III-V compound semiconductor containing arsenic as group V element, a second emitter layer made of group III-V compound semiconductor having a different etch resistance from said emitter passivation layer, and an emitter electrode layer having a different etch resistance from both said emitter passivation layer and said second emitter layer, formed in this order from the bottom;

partially etching said emitter electrode layer to form an emitter electrode;

etching said second emitter layer to expose a surface of said emitter passivation layer and side-etching said second emitter layer to form an overhang of said emitter electrode extending outward from an edge of said second emitter layer, by using said emitter electrode as a mask;

isotropically forming an insulation film on exposed surfaces of said emitter electrode, said second emitter layer, and said emitter passivation layer;

anisotropically etching said insulation film to form a side wall member on a side surface and a partial bottom surface of said emitter electrode, on side surface of said second emitter layer, and on a surface of said emitter passivation layer beneath said overhang of said emitter electrode;

forming a conductive film on exposed surface of said emitter passivation layer; and performing a thermal treatment to form an alloy in a region of said emitter passivation layer and said first emitter layer corresponding to said conductive film, the alloy forming an ohmic contact of said conductive film with said base layer.

29. A method of manufacturing a heterojunction bipolar semiconductor device comprising the steps of:

preparing a semiconductor substrate having a multilayer structure including a base layer made of group III-V compound semiconductor containing arsenic as group V element, a first emitter layer made of group III-V compound semiconductor containing phosphorus as group V element, an emitter passivation layer made of group III-V compound semiconductor containing arsenic as group V element, an etching stopper layer made of group III-V compound semiconductor having a different etch resistance from said emitter passivation layer, and a second emitter layer made of group III-V compound semiconductor and having a different etch resistance from said etching stopper layer, formed in this order from the bottom;

partially etching said second emitter layer and stopping etching at a surface of said etching stopper layer;

partially etching said etching stopper layer and stopping etching at a surface of said emitter passivation layer, by using said second emitter layer as a mask;

forming an insulation film over whole surface of said semiconductor substrate;

forming an opening in said insulation film at a base electrode forming region by photolithography to expose a surface of said emitter passivation layer;

forming a base electrode on the exposed surface of said emitter passivation layer; and performing a thermal treatment to form an alloy in a region of said emitter passivation layer and said first emitter layer corresponding to said base electrode, the alloy forming an ohmic contact of said base electrode with said base layer.

30. A method of manufacturing a heterojunction bipolar semiconductor device comprising the steps of:

preparing a semiconductor substrate having a multilayer structure including a base layer made of group III–V compound semiconductor containing arsenic as group V element, a first emitter layer made of group III–V compound semiconductor containing phosphorus as group V element, an emitter passivation layer made of group III–V compound semiconductor containing arsenic as group V element, a second emitter layer made of group III–V compound semiconductor having a different etch resistance from said emitter passivation layer, an etching stopper layer made of group III–V compound semiconductor having a different etch resistance from said second emitter layer, and an emitter cap layer made of group III–V compound semiconductor having a different etch resistance from said etching stopper layer, formed in this order from the bottom;

partially dry-etching said emitter cap layer and stopping etching at a surface of said etching stopper layer;

partially wet-etching said etching stopper layer by using said emitter cap layer as a mask, and stopping etching at a surface of said second emitter layer;

partially etching said second emitter layer by using said etching stopper layer as a mask, and stopping etching at a surface of said emitter passivation layer;

forming an insulation film over whole exposed surface of said semiconductor substrate;

forming an opening in said insulation film at a base electrode forming region by photolithography to expose a surface of said emitter passivation layer;

forming a base electrode on the exposed surface of said emitter passivation layer; and performing a thermal treatment to form an alloy in said emitter passivation layer and said first emitter layer at a region corresponding to said base electrode, and forming an ohmic contact of said base electrode with said base layer.

31. A heterojunction bipolar semiconductor device comprising:

a support substrate;

a collector layer formed on said support substrate and made of group III–V compound semiconductor;

a base layer formed on said collector layer and made of group III–V compound semiconductor containing arsenic as group V element;

a first emitter layer formed on said base layer and made of group III–V compound semiconductor containing phosphorus as group V element, said first emitter layer having a band gap wider than said base layer;

a second emitter layer formed on said first emitter layer and made of semiconductor having a function of enhancing formation of an ohmic contact to said first emitter layer; and a base electrode forming an ohmic contact with said base layer, wherein:

whole upper surface of said base layer is covered with said first emitter layer or with said first emitter layer and said base electrode;

The base electrode has an extension of reacted region into underlying semiconductor layer or layers, which region does not contain Au; and a region of said first emitter layer adjacent to an edge of said base electrode is depleted throughout a full depth thereof.

32. A heterojunction bipolar semiconductor device according to claim 3, further comprising a third emitter layer formed between said emitter passivation layer and said second emitter layer, said third emitter layer being made of group III–V compound semiconductor containing phosphorus as an group V element and having a wider band gap than said base layer.

33. A heterojunction bipolar semiconductor device according to claim 32, wherein approximately a whole upper area of said emitter passivation layer is covered with said third emitter layer or with said third emitter layer and said base electrode.

34. A heterojunction bipolar semiconductor device according to claim 33, wherein said first and third emitter layers are made of InGaP, and said emitter passivation layer being made of GaAs or AlGaAs.

35. A method of manufacturing a heterojunction bipolar semiconductor device, comprising the steps of:

forming a collector layer made of group III–V compound semiconductor on a compound semiconductor substrate;

forming a base layer made of group III–V compound semiconductor on said collector layer;

forming a lower emitter layer on said base layer, said lower emitter layer being made of group III–V compound semiconductor containing phosphorus as a group V element and having a wider band gap than the III–V group semiconductor of said base layer;

forming an emitter passivation layer made of group III–V compound semiconductor on said lower emitter layer;

forming a middle emitter layer on said emitter passivation layer, said middle emitter layer being made of group III–V compound semiconductor containing phosphorus as a group V element and having a wider band gap than the III–V group semiconductor of said base layer;

forming an upper emitter layer made of group III–V compound semiconductor on said middle emitter layer;

forming an emitter electrode on said upper emitter layer;

etching and partially leaving said upper emitter layer under said emitter electrode, by using said emitter electrode as a mask and said middle emitter layer as an etching stop layer;

forming an insulating film on an upper and side surface of said emitter electrode, on a side surface of said upper emitter layer, and on an upper surface of said middle emitter layer;

anisotropically etching and partially leaving said insulating film at least on the side surface of said emitter electrode, on the side surface of said upper emitter layer, and on a partial area of the upper surface of said middle emitter layer continuous with the side surface of said upper emitter layer; and depositing a metal material on said emitter electrode and on an area beside said insulating film and forming a base electrode electrically connected to said base layer on the area beside said insulating film.

36. A heterojunction bipolar semiconductor device according to claim 35, further comprising the step of, after said step of anisotropically etching and partially leaving said insulating film and before said step of forming said base electrode, etching a laminate of said middle emitter layer, said emitter passivation layer, and said lower emitter layer at least by a partial depth, and leaving the whole depth of said laminate structure only under said emitter electrode and said insulating film.

* * * * *

UNITED STATES PATENT AND TRADEMARK OFFICE
CERTIFICATE OF CORRECTION

PATENT NO. : 5,682,046 Page 1 of 1
APPLICATION NO. : 08/553034
DATED : October 28, 1997
INVENTOR(S) : Tsuyoshi Takahashi et al.

It is certified that error appears in the above-identified patent and that said Letters Patent is hereby corrected as shown below:

<u>In Column 17, Claim 9, Line 47;</u>

On line 2, change "claim 8" to be --claim 3--

Signed and Sealed this

Thirtieth Day of December, 2008

JON W. DUDAS
*Director of the United States Patent and Trademark Office*